United States Patent
Masui et al.

(10) Patent No.: US 7,746,971 B2
(45) Date of Patent: Jun. 29, 2010

(54) DATA RECOVERY METHOD, DATA RECOVERY CIRCUIT, DATA TRANSMITTING/RECEIVING APPARATUS AND INFORMATION PROCESSING APPARATUS

(75) Inventors: Naruhiro Masui, Kanagawa (JP); Hidetoshi Ema, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 720 days.

(21) Appl. No.: 11/376,064

(22) Filed: Mar. 16, 2006

(65) Prior Publication Data

US 2006/0227916 A1 Oct. 12, 2006

(30) Foreign Application Priority Data

Mar. 17, 2005 (JP) .............................. 2005-077646

(51) Int. Cl.
*H04L 7/00* (2006.01)
(52) U.S. Cl. ...................................... 375/355; 375/360
(58) Field of Classification Search ................. 375/355, 375/360, 376, 373; 327/341, 291, 244, 156, 327/160, 144, 147; 370/518, 516
See application file for complete search history.

(56) References Cited

U.S. PATENT DOCUMENTS

| | | | | |
|---|---|---|---|---|
| 6,441,667 | B1 * | 8/2002 | Boerstler et al. | 327/295 |
| 6,831,491 | B2 * | 12/2004 | Karlquist | 327/156 |
| 7,142,486 | B2 | 11/2006 | Masui et al. | |
| 2001/0033188 | A1 * | 10/2001 | Aung et al. | 327/141 |
| 2002/0027964 | A1 | 3/2002 | Yoo et al. | |
| 2002/0085657 | A1 * | 7/2002 | Boerstler | 375/373 |
| 2002/0085658 | A1 * | 7/2002 | Boerstler | 375/376 |
| 2002/0140486 | A1 * | 10/2002 | Boerstler et al. | 327/291 |
| 2003/0190006 | A1 * | 10/2003 | Nagano | 375/376 |
| 2004/0078613 | A1 * | 4/2004 | Boerstler et al. | 713/400 |
| 2004/0114632 | A1 * | 6/2004 | Yuuki et al. | 370/503 |
| 2004/0202266 | A1 | 10/2004 | Gregorius et al. | |

(Continued)

FOREIGN PATENT DOCUMENTS

| EP | 1 538 775 A1 | 8/2005 |
|---|---|---|
| JP | 2002-190724 | 7/2002 |

(Continued)

OTHER PUBLICATIONS

Chih-Kong Ken Yang, Ramin farjad-rad and Mark A. Horowitz, "A 0.5-m CMOS 4.0-Gbit/s Serial Link Transceiver with Data Recovery Using Oversampling" 1998 IEEE.*

*Primary Examiner*—Chieh M Fan
*Assistant Examiner*—Aristocratis Fotakis
(74) *Attorney, Agent, or Firm*—Dickstein Shapiro LLP

(57) ABSTRACT

Serially transferred data is over sampled with a multiphase clock signal generated as a result of shifting a predetermined frequency clock signal by a predetermined phase each, to obtain over sampling data; generating clock patterns, having mutually different phase states according to a data phase state of the over sampling data. A first phase pattern generated from the over sampling data is compared with a second phase pattern generated from the clock pattern, and the number of bits to extract from the over sampling data is controlled. A phase error of the over sampling data is detected based on the first phase pattern and the second phase pattern. Bits to extract from the over sampling data is selected to restore the data based on the phase state of the clock pattern and the phase error.

24 Claims, 23 Drawing Sheets

U.S. PATENT DOCUMENTS

2004/0205416 A1* 10/2004 Shirota .................. 714/48
2005/0069070 A1* 3/2005 Paillet et al. ............ 375/355
2005/0135527 A1* 6/2005 Masui et al. ............ 375/355

FOREIGN PATENT DOCUMENTS

JP  2004-128980  4/2004
WO  WO 03/036853 A1  5/2003

* cited by examiner

| state | CKP[0:11] | Sel[0:11] | |
|---|---|---|---|
| St0 | 000111 000111 | 000100 000100 | |
| St1 | 001110 001110 | 001000 001000 | |
| St2 | 011100 011100 | 010000 010000 | |
| St3 | 111000 111000 | 100000 100000 | 000000 100000 (@St4→St3) |
| St4 | 110001 110001 | 000001 000001 | 100001 000001 (@St3→St4) |
| St5 | 100011 100011 | 000010 000010 | |

FIG.11
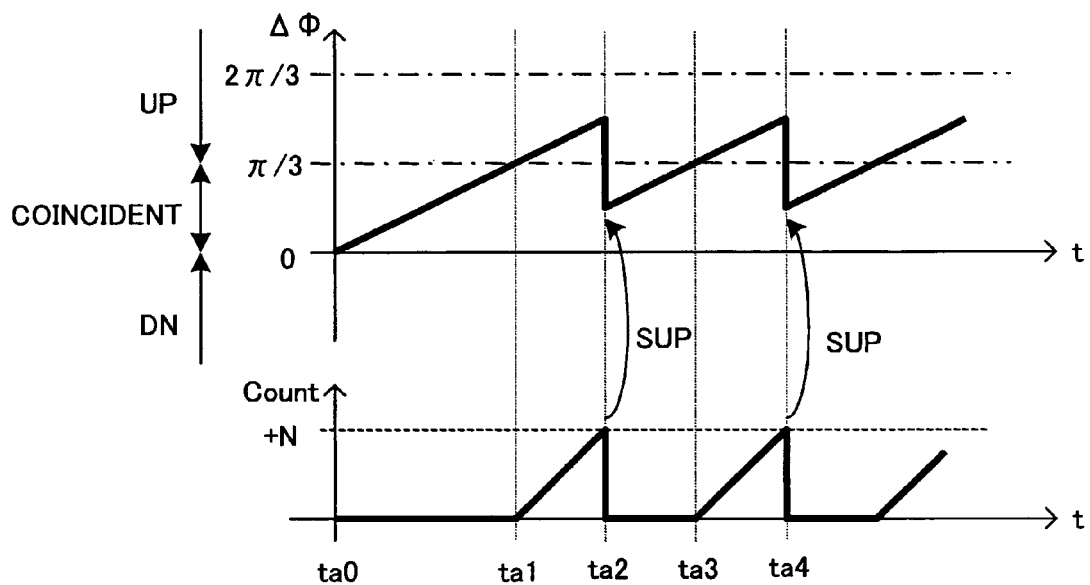
(a)
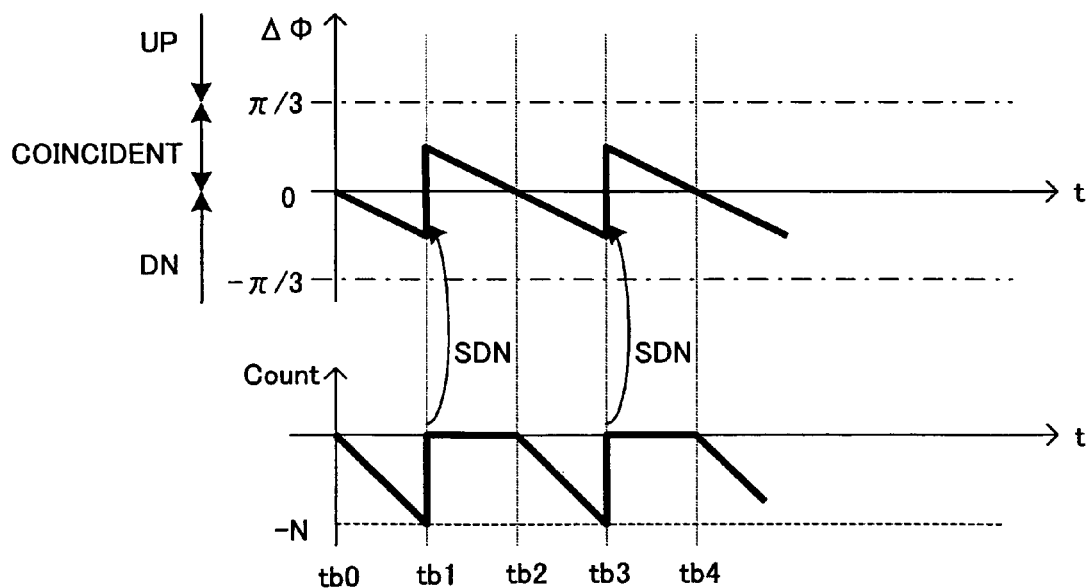
(b)

|  |  | RxEdge | | | | | | | | | | | |
|---|---|---|---|---|---|---|---|---|---|---|---|---|---|
|  |  | [0] | [1] | [2] | [3] | [4] | [5] | [6] | [7] | [8] | [9] | [10] | [11] |
| state | St0 | 0 | +1 | +2 | * | -2 | -1 | 0 | +1 | +2 | * | -2 | -1 |
|  | St1 | +1 | +2 | * | -2 | -1 | 0 | +1 | +2 | * | -2 | -1 | 0 |
|  | St2 | +2 | * | -2 | -1 | 0 | +1 | +2 | * | -2 | -1 | 0 | +1 |
|  | St3 | * | -2 | -1 | 0 | +1 | +2 | * | -2 | -1 | 0 | +1 | +2 |
|  | St4 | -2 | -1 | 0 | +1 | +2 | * | -2 | -1 | 0 | +1 | +2 | * |
|  | St5 | -1 | 0 | +1 | +2 | * | -2 | -1 | 0 | +1 | +2 | * | -2 |

DATA RECOVERY METHOD, DATA RECOVERY CIRCUIT, DATA TRANSMITTING/RECEIVING APPARATUS AND INFORMATION PROCESSING APPARATUS

BACKGROUND OF THE INVENTION

1. Field of the Invention

The present invention relates to a data recovery method and a data recovery circuit for restoring serially transferred data, a data transmitting/receiving apparatus and an information processing apparatus.

2. Description of the Related Art

Recently, along with an increasing demand for a large-size, high-speed data transmission between devices, boards or chips, various high-speed interface such as USB ((Universal Serial Bus), Serial ATA, IEEE1394, 1G/10G Ethernet (registered trademark), InfiniBand, RapidIO, Fibre Channel and PCI Express, have been proposed, put in practical use, and thus, a tendency for a higher transmission speed and a larger transmission data size may increase also in future.

Many of these high-speed interfaces apply a serial transfer way, in which data is transmitted in synchronization with a predetermined frequency clock signal. The clock signal of the frequency is embedded in data to transfer (embedded clock signal), and, on a reception side, the clock signal is extracted from the reception data, and the reception data is restored with the use of the extracted clock signal (for example, see Japanese Laid-open Patent Application No. 2004-128980). A circuit carrying out such operation is called a clock data recovery circuit (simply referred to as CDR: Clock Data Recovery, hereinafter).

In CDR in the related art, PLL (Phase Locked Loop) circuit is commonly used. VCO (Voltage Controlled Oscillator) included in PLL is controlled in such a manner as to be in synchronization with a phase of the reception data, and a reproduction clock signal is extracted. Then, the reproduction clock signal is used as a reference clock signal, the reception data is latched, and thus, the reception data is accurately restored.

However, as a data transfer rate improves for the purpose of achieving recent high speed data transfer (for example, as the data transfer rate exceeding Gbps order), the oscillation frequency of VOC exceeds Gbps order, and, achieving the CDR circuit having a function of restoring such high-speed data may be difficult. Further, negative factors such as increase in the chip size, increase in the power consumption, increase in the costs, and so forth, may occur at the same time.

Further, when the data transfer rate increases, wiring delay may become unignorable. Accordingly, device layout, wiring layout and so forth should be considered more carefully. Thus circuit design may become difficult. Further, since characteristics of devices to actually apply may influence this matter much, re-design of layout may be required for each process (and, also, re-design of the circuit itself may be required). Thus, circuit reusability may degrade, and required development time may increase accordingly.

In order to solve the problem, an over sampling type clock data recovery circuit has been proposed (for example, see B. Kim et al., "A 30-MHz Hybrid Analog/Digital Clock Recovery Circuit in 2-um CMOS", IEEE JSSC, December 1990, pp 1385-1394). FIG. 1 shows a circuit configuration of the over sampling type clock data recovery circuit in the related art. A multiphase clock generating part 200 includes PLL, DLL (Delay Locked Loop) or such, and generates mutually equal interval multiphase clock signals from a reference clock signal RefCLK. Flip-flop devices (which may be simply referred to as FFs or F/Fs, hereinafter) 201 input data to their data terminals, input respective clock signals of the multiphase clock signals from the multiphase clock generating part 200 to their clock terminals, and take the input data upon rising up (or decaying down) of the respective clock signals.

That is, data output from FFs 201 is one obtained from sampling of the input data with the clock signals having phases slightly different from each other. A digital PLL 202 detects change timing of the data provided by FFs 201, selects the multiphase clock signal which is in synchronization with the thus-detected change timing, and restores it as a reproduction clock signal RecCLK. Further, the DPLL 202 selects data with the reproduction clock signal RecCLK and a clock signal having a predetermined phase difference therefrom (for example, an opposite phase), and outputs the same. Upon selecting the reproduction clock signal, a filter is applied to smooth the data change timing. A signal processing part (not shown) operates with the use of the reproduction clock signal RecCLK as a reference clock signal. Such a configuration of the CDR circuit may be made of a digital circuit except the multiphase clock generating part, and thus, such a circuit may be relatively easily achieved.

The multiphase clock signals may previously have equal phase intervals therebetween. FIG. 2 shows one example illustrating a problem occurring when the multiphase clock signals do not have equal phase intervals. Here, description is made assuming 4 phases, as one example. In FIG. 2, it is assumed that a phase of a reproduction clock signal CLK2 thus selected delays by $\Delta$ from an ideal state. Respective data in the signal processing part operates in synchronization with the reproduction clock signal CLK2.

When the reproduction clock signal is switched to a phase of CLK1 at a timing Tsw, a period of the reproduction clock signal is reduced further by $\Delta$ in addition to the original phase difference locally, a set up time Tsu' in FF cannot be sufficiently ensured, and, at the worst, malfunction may occur. This is because, even though design is made such that equal phase intervals should be provided from the multiphase clock generating part 100, skew (for example, wiring delay, load or such, may influence this matter) in each clock signal, up to the output end of the reproduction clock signal RecCLK, may cause the problem. Such phenomena may become more remarkable when the data transfer speed increases. In order to avoid the problem, possible delay amounts in the respective multiphase clock signals should be adjusted at respective parts, which may be difficult to actually achieve, and thus, the above-mentioned problem may not be completely solved.

Further, a method of applying a phase interpolator in the multiphase clock generating part to adjust the phase has been proposed (for example, see Japanese Laid-open Patent Application No. 2002-190724). By providing the phase interpolator or such, the phases of the multiphase clock signals can be made to have equal intervals.

SUMMARY OF THE INVENTION

However, a circuit size of the CDR circuit may increase when the above-mentioned phase interpolator is applied. Further, wiring delay may not be unignorable due to an increase in data transfer rate. In order to reduce the wiring delay, the phases of the multiphase clock signals should be made coincident at each input end. However, difficulty may arise, the same as that for actual achievement of the over sampling type CDR circuit operating at an over sampling frequency (in the example of FIG. 2, four times the frequency of the clock signal included in the transferred data).

That is, in an apparatus such as the CDR circuit employing an analog PLL or the over sampling type CDR circuit in the related art, in which the clock signal is reproduced from the input data, and signal processing is carried out with the restored clock signal, achievement of CRD becomes difficult along with the increase in the data transfer rate. Then, the required development period may increase by the bottleneck of the design period for the CDR part. This tendency may become more remarkable along with a further increase in the data transfer rate in future, and thus, actual achievement of the ideal configuration may become further difficult.

The present invention has been devised in consideration of the problem, and an object of the present invention is to provide a data recovery circuit and a method thereof for restoring data from input data embedding a clock signal, with the use of a separate clock signal, without actually restoring the embedded clock signal.

The object of the present invention is to provided an improved data recovery circuit and a method thereof without actually restoring a clock signal embedded in input data, and to provide a data recovery circuit and a method thereof, as well as a data transmitting/receiving apparatus and an information processing apparatus, in which, even when jitter (temporal shift of data change timing) in the input data increases, data can be accurately restored.

The present invention is characterized by a data recovery method for restoring serially transferred data by carrying out over sampling, including:

a sampling step of over sampling the serially transferred data with multiphase clock signals generated as a result of shifting a predetermined frequency clock signal by a predetermined phase each, to obtain over sampling data;

a clock pattern generating step of generating a clock pattern (for example, CKP), having mutually different phase states (for example, St0 through St5) according to a data phase state of the over sampling data;

a phase state control step of comparing a first phase pattern (for example, RxEdge) generated from the over sampling data and a second phase pattern (for example, CKEdge) generated from the clock pattern, and controlling the number (for example, S0 through S2) of bits to extract from the over sampling data;

a phase error detecting step of detecting a phase error (for example, Err) of the over sampling data based on the first phase pattern and the second phase pattern; and a data selecting step of selecting bits to extract from the over sampling data to restore the data based on the phase state of the clock pattern and the phase error detected in the phase error detecting step.

According to the present invention, it is possible to provide an improved data recovery circuit and a method thereof without actually restoring a clock signal embedded in input data, or to provide a data recovery circuit and a method thereof, as well as a data transmitting/receiving apparatus and an information processing apparatus, in which, even when jitter in the input data increases, data can be accurately restored. It is noted that, as long as phase advance or phase delay of the over sampling data can be detected, the phase pattern generated from the over sampling data or the clock pattern may be generated in any manner.

Further, in one mode of the data recovery method according to the present invention, in the phase error detecting step, a moving average of the phase error of a predetermined period is calculated, and is used as the phase error in the data selecting step.

In this configuration, by calculating average of the phase error in the predetermined period, a high frequency component of jitter is averaged, and the phase error can be detected.

Further, in another mode of the data recovery method according to the present invention, in the phase error detecting step, phase advance or phase delay is determined based on the phase error immediately before the phase error becomes approximately $\pi$.

In this configuration, even when the phase error becomes more than or less than the predetermined value, that is, even in a phase state such that determination for phase advance or phase delay is difficult, the phase advance/delay can be determined from the phase error immediately before the phase error becomes more than or less than the predetermined value. Thus, the appropriate phase error can be extracted.

Further, in another mode of the data recovery method according to the present invention, in the phase error detecting step, during calculation of the phase error average, when the phase state of the clock pattern changes, the phase error is corrected according to the change state.

In this configuration, even when the phase state from which the phase error is detected changes during the averaging calculation, the phase error can be corrected according to the change state, and thus, the appropriate phase error can be extracted.

Further, in another mode of the data recovery method according to the present invention, a period of determining, in the clock pattern generating step, whether or not the clock pattern should be changed to have a different phase state, is longer than the predetermined period for calculating the moving average of phase error.

In this configuration, phase error averaging is carried out within the period shorter than the period of determining whether or not the change of the clock pattern's phase state should be changed. Accordingly, a high frequency jitter component included in a jitter component changing faster than the change in the clock pattern phase state is averaged, and, according thereto, the phase of the restored data is selected. Accordingly, data can be taken always approximately at the center of eye opening, ands thus, data can be stably restored. That is, since even the jitter component lower than a band of the moving average can be suppressed, a jitter allowable value can be increased.

Further, in another mode of the data recovery method according to the present invention, the data selecting step includes: a first selecting step of selecting a plurality of candidates of bits to extract from the over sampling data based on the phase state of the clock pattern; and a second selecting step of extracting one bit from the plurality of candidates based on the phase error detected in the phase error detecting step.

In this configuration, a bit approximately at the center of the eye opening can be selected based on the detected phase error, and thus, data can be precisely restored.

Further, the present invention is characterized by a data recovery circuit for restoring serially transferred data by carrying out over sampling, including:

a sampling part configured to over sample the serially transferred data with multiphase clock signals generated as a result of shifting a predetermined frequency clock signal by a predetermined phase each, to obtain over sampling data;

a clock pattern generating part configured to generate a clock pattern, having mutually different phase states according to a data phase state of the over sampling data;

a phase state control part configured to compare a first phase pattern generated from the over sampling data and a second phase pattern generated from the clock pattern, and control the number of bits to extract from the over sampling data;

a phase error detecting part configured to detected a phase error of the over sampling data based on the first phase pattern and the second phase pattern; and a data selecting part configured to select bits to extract from the over sampling data to restore the data based on the phase state of the clock pattern and the phase error detected by the phase error detecting part.

Further, in another mode of the data recovery circuit according to the present invention, the phase error detecting part calculates a moving average of the phase error of a predetermined period, which is used as the phase error by the data selecting part.

Further, in another mode of the data recovery circuit according to the present invention, the phase error detecting part determines phase advance or phase delay based on the phase error immediately before the phase error becomes approximately $\pi$.

Further, in one mode of the data recovery circuit according to the present invention, during calculation of the phase error average, when the phase state of the clock pattern changes, the phase error detecting part corrects the phase error according to the change state.

Further, in another mode of the data recovery circuit according to the present invention, a period of determining, by the clock pattern generating part, whether or not the clock pattern should be changed tog have a different phase state, is longer than the predetermined period for calculating the moving average of the phase error.

Further, in another mode of the data recovery circuit according to the present invention, the data selecting part includes:

a first selecting part configured to select a plurality of candidates of bits to extract from the over sampling data based on the phase state of the clock pattern; and a second selecting part configured to extract one bit from the plurality of candidates based on the phase error detected by the phase error detecting part.

Further, the present invention is characterized by a data transmitting/receiving apparatus, including:

a data transmitting part serially transferring data in synchronization with a clock signal of a frequency f1;

a sampling part configured to over sample the serially transferred data with multiphase clock signals generated as a result of shifting a frequency f2 clock signal by a predetermined phase each, to obtain over sampling data;

a clock pattern generating part configured to generate a clock pattern, having mutually different phase states according to a data phase state of the over sampling data;

a phase state control part configured to compare a first phase pattern generated from the over sampling data and a second phase pattern generated from the clock pattern, and control the number of bits to extract from the over sampling data;

a phase error detecting part configured to detect a phase error of the over sampling data based on the first phase pattern and the second phase pattern; and a data selecting part configured to select bits to extract from the over sampling data to restore the data based on the phase state of the clock pattern and the phase error detected by the phase error detecting part.

Further, in another mode of the data transmitting/receiving apparatus according to the present invention, the phase error detecting part calculates a moving average of the phase error of a predetermined period, which is used as the phase error by the data selecting part.

Further, in another mode of the data transmitting/receiving apparatus according to the present invention, the phase error detecting part determines phase advance or phase delay based on the phase error immediately before the phase error becomes approximately $\pi$.

Further, in another mode of the data transmitting/receiving apparatus according to the present invention, during calculation of the phase error average, when the phase state of the clock pattern changes, the phase error detecting part corrects the phase error according to the change state.

Further, in another mode of the data transmitting/receiving apparatus according to the present invention, a period of determining by the clock pattern generating part whether or not the clock pattern should be changed to have a different phase state is longer than the predetermined period for calculating the moving average of the phase error.

Further, in another mode of the data transmitting/receiving apparatus according to the present invention, the data selecting part includes:

a first selecting part configured to select a plurality of candidates of bits to extract from the over sampling data based on the phase state of the clock pattern; and a second selecting part configured to extract one bit from the plurality of candidates based on the phase error detected by the phase error detecting part.

Further, the present invention provides an information processing apparatus employing any one of the above-described data recovery apparatuses according to the present invention.

According to the present invention, it is possible to provide an improved data recovery circuit and a method thereof without actually restoring a clock signal embedded in input data, or to provide a data recovery circuit and a method thereof, as well as a data transmitting/receiving apparatus and an information processing apparatus, in which, even when jitter in the input data increases, data can be accurately restored.

BRIEF DESCRIPTION OF THE DRAWINGS

Other objects and further features of the present invention will become more apparent from the following detailed description when read in conjunction with the accompanying drawings:

FIG. 11 illustrates bit synchronization operation in a data recovery circuit in one embodiment of the present invention;

DETAILED DESCRIPTION OF THE PREFERRED EMBODIMENTS

With reference to figures, preferred embodiments of the present invention are described.

A first embodiment of the present invention is described.

First, a physical layer of a serial transfer part in which a data recovery circuit in the first embodiment is applied is described.

Figure 1:
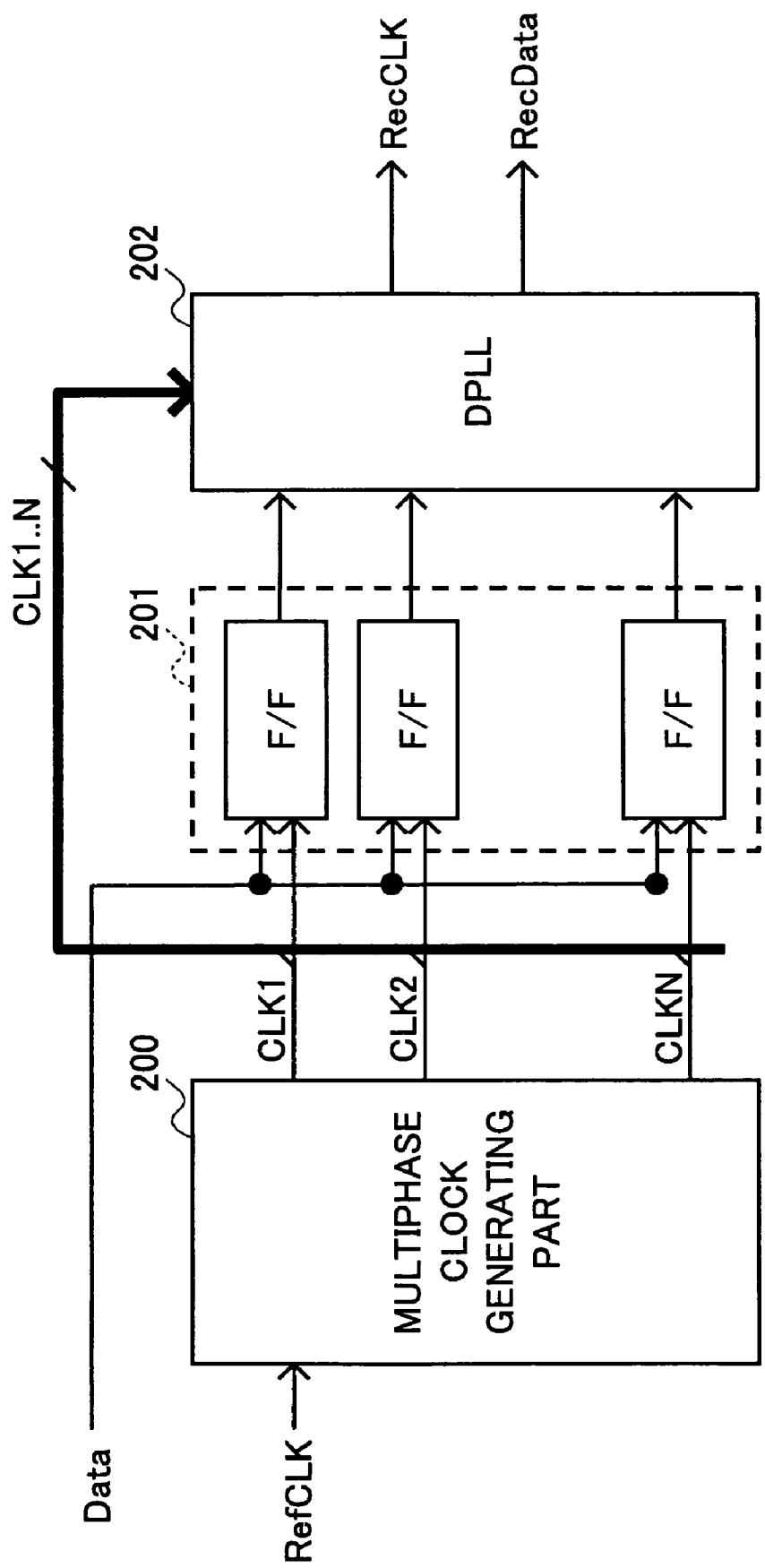
FIG. 1 shows a configuration diagram of an over sampling type CDR circuit in the related art.
Figure 2:
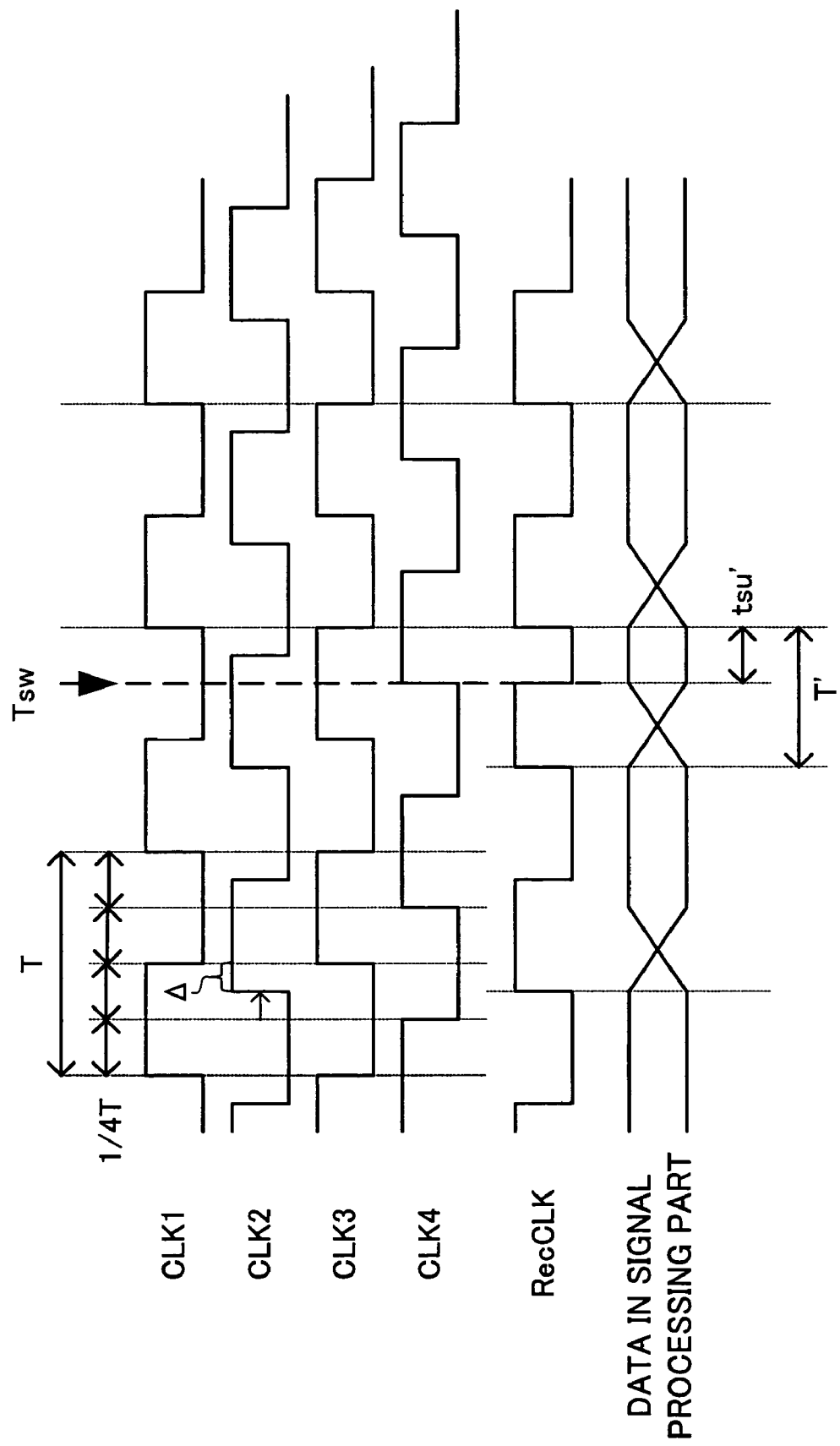
FIG. 2 shows one example of a problem occurring when multiphase clock signals do not have equal phase intervals.
Figure 3:
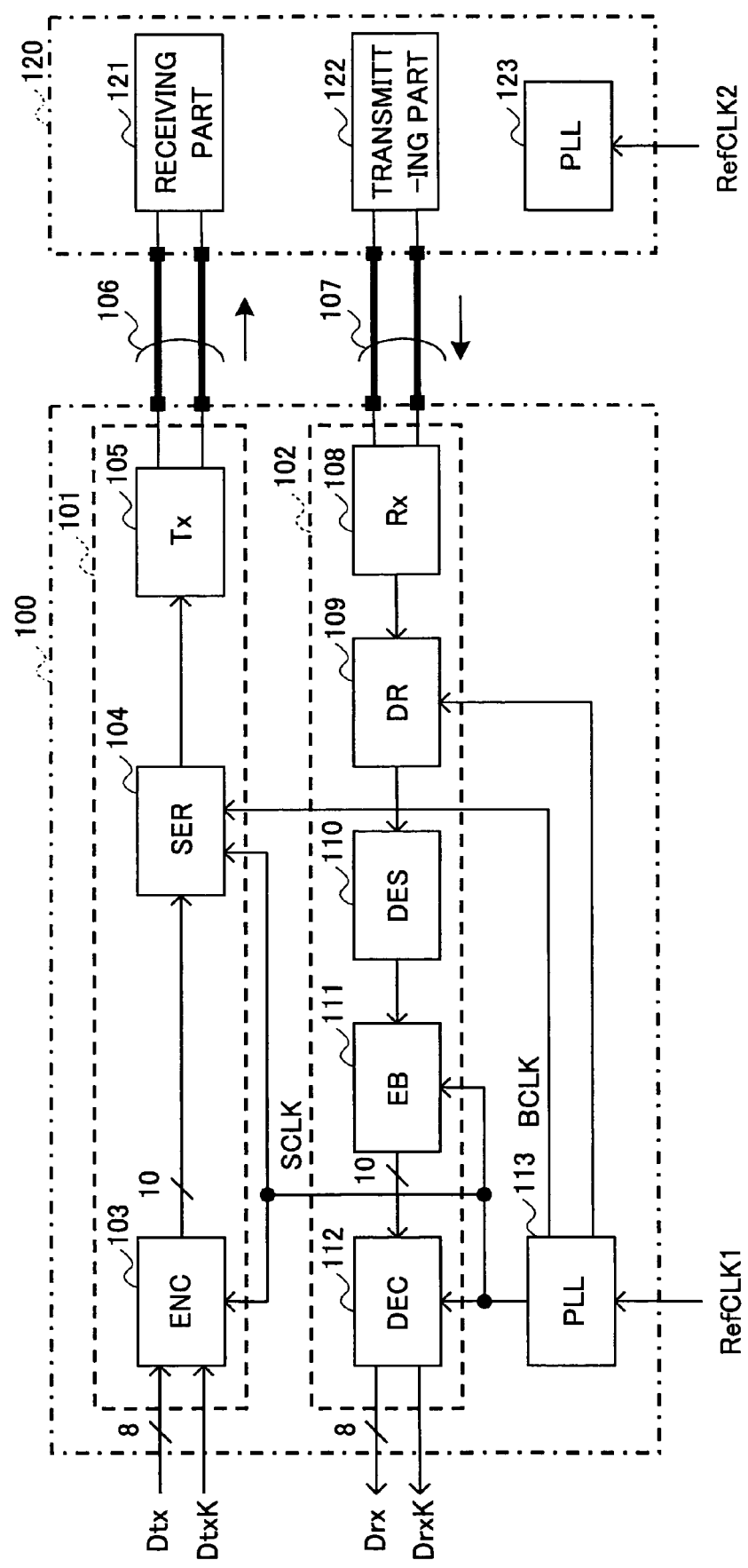
FIG. 3 shows an entire configuration diagram of a physical layer part of a serial transfer part in which a data recovery circuit according to an embodiment of the present invention is applied.

FIG. 3 shows the entire configuration of the physical layer part 100 of the serial transfer part. The physical layer part 100 includes a transmitting part 101 transmitting data and a receiving part 102 receiving data. A set of these parts 101 and 102 is called a port.

Serial transfer is carried out in a point-to-point manner, and the port corresponds to another opposite port. In the opposite port, a physical layer part 120 including a transmitting part 121 and a receiving part 122, having the same functions, is provided.

Transmission channels 106 and 107 in the present embodiment form a duplex channel in which transmission and reception can be carried out by separate channels simultaneously. However, such a duplex channel is not necessarily required. The data recovery circuit in the first embodiment may also be applied to a case where a one side duplex channel is applied. Each of the channels 106 and 107 includes two electric wires. However, they may be made by radio channels.

The transmitting part 101 includes an encoder part ENC 103 encoding transmission data Dtx provided by a host layer, according to a predetermined conversion rule; a serializer SER 104 converting the encoded data into serial data; and a transmission output part Tx 105 transmitting the serially converted data to the transmission channel 106.

Transmission on the transmission channel 106 is carried out with a differential signal. Further, 8B/10B conversion is applied to the encoding in the encoder part ENC 103. 8B/10B conversion is one in which 8-bit data is converted into 10-bit data (referred to as symbol data, hereinafter). That is, in addition to 8-bit data, a control bit called K code (or K character), other than data, is added, and thus, special code for control is added. 8B/10B conversion is well-known, and details are omitted.

The physical layer 100 has a PLL part 113, which generates, based on a given reference clock signal RefCLK1, a transfer clock signal BCLK of a frequency determined according to a respective standard for data transfer, and a clock signal PCLK obtained through 10 frequency dividing the transfer clock signal BCLK. For example, when data transfer is carried out at 2.5 Gbps, the transfer clock signal is of 2.5 GHz, and the clock signal PCLK is of 250 MHz. The encoder part 103 has the clock PCLK provided thereto, and the serializer 104 has the clock signals PCLK and BCLK provided thereto. Thus, the respective parts operate therewith. Data transfer with the host layer is also carries out in synchronization with the clock signal PCLK.

The receiving part 102 includes a receiving input part Rx 108 binarizing the differential signal transmitted via the transmission channel 107; a data recovery part DR 109 restoring data from the received signal (reception data); a de-serializer DES 110 converting the resorted data into parallel 10-bit symbol data; an elastic buffer EB 111 absorbing a clock signal frequency difference between the transmission side and the reception side; and a decoder DEC 112 carrying out 10B/8B conversion converting the 10-bit symbol data into 8-bit data.

The opposite transmitting part 122 carries out transmission in synchronization with a clock signal generated based on a reference clock signal RefCLK2 by PLL 123. On the other hand, the receiving part 102 should absorb the frequency difference in the reference clock signals since it should finally output the reception data to the host layer in synchronization with a clock signal generated based on the reference clock RefCLK1 by PLL 113.

The elastic buffer EB 111 is provided to absorb the frequency difference. For example it absorbs the frequency difference by adding or deleting the special code. The elastic buffer EB 111 may be provided subsequent to the decoder part. An allowable value of the frequency difference is defined by each interface standard.

The recovery circuit in the embodiment is applied in the data recovery part DR 109, and also, has a function of the de-serializer DES 110. Accordingly, the configurations/functions of the other parts than the data recovery part 109 may be changed as long as a significant deviation does not occur from the concept of the present invention described below. Further, as described later, multiphase clock signals CK0 through CK11 are provided to the data recovery part DR 109 in the configuration of FIG. 3, and a common clock signal also supplied to the transmitting part 101 is utilized.

This is because, the opposite physical layer parts 100 and 120 are configured to operate with clock signals generated from the separate reference clock signals RefCLK1 and RefCLK2, respectively. The entirety of the physical layer part 100 thus operates with the clock signal generated from the reference clock signal RefCLK1 separate from the reference clock signal RefCLK2 of the opposite port, and, as will be described later, the physical layer 100 can utilize PLL 113 in common, whereby the circuit (chip size) can be miniaturized, and the costs can be reduced.

Figure 4:
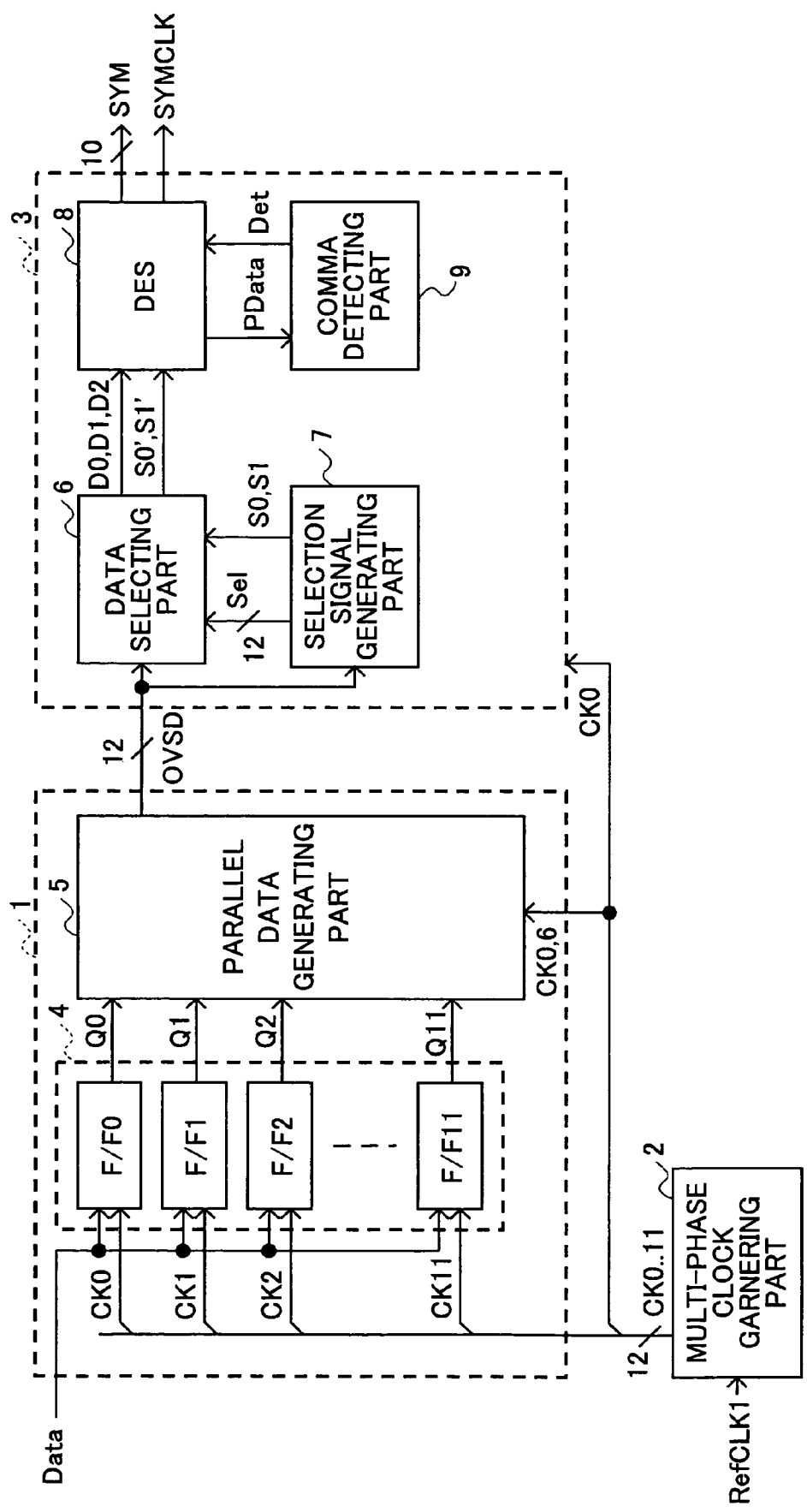
FIG. 4 shows a block diagram of the data recovery circuit.

The embodiment of the data recovery circuit is described next. FIG. 4 shows a block diagram of the data recovery circuit in the present embodiment. The data recovery circuit includes an over sampling part 1, a multiphase clock generating part 2 and a symbol restoring part 3.

The over sampling part 1 takes reception data Data with multiphase clock signals provided by the multiphase clock generating part 2, and outputs over sampling data OVSD.

The symbol restoring part 3 restores 10-bit symbol data SYM from the over sampling data OVSD, generates a symbol clock signal SYMCLK, and thus, has both a data recovery function and a de-serializer function. The symbol data restoring part 3 includes a data selecting part 6, a selection signal generating part 7, a de-serializer DES 8 and a comma detecting part 9. The symbol data restoring part 3 operates with one clock signal CK0 from among the multiphase clock signals.

The multiphase clock generating part 2 shifts a clock signal of a predetermined frequency generated from the reference clock signal RefCLK1, by a predetermined phase each, and thus, generates the multiphase clock signals having approximately equal interval phase differences thereamong.

In the present embodiment, the multiphase clock signals CK0 through CK11 thus generated have a frequency $f2$ approximately ½ of the transfer clock signal BCLK for which a period UI is defined, and have phase differences, for example, ⅙ UI each. For example, when the transfer rate is 2.5 Gbps (UI=400 ps), 12 clock signals having a phase difference of 66.7 ps each in 800 ps (1.25 GHz), are generated.

It is noted that, the multiphase clock signal frequency $f2$ should not necessarily be ½ of the transfer clock. For example, ¼ may be applied instead and 24 clock signals may be generated. Alternatively, the same frequency as that of the transfer clock signal may be applied. Further, the phase difference in the multiphase clock signals should not be limited to ⅙ of the period UI of the transfer clock signal. Further, although the data recovery circuit in the present embodiment includes the multiphase clock generating part 2, the multiphase clock generating part 2 may be provided separate from the data recovery circuit.

Thus, by using the multiphase clock signals having the frequency $f2$ set lower than the transfer clock signal frequency $f1$ in the data recovery circuit, the operating frequencies of respective parts and the oscillation frequency in the multiphase clock generating part can be lowered and thus, realization thereof becomes easier.

In the present embodiment, the multiphase clock generating part 2 may be used also as PLL 113 of FIG. 3. Details are described later.

Next, details of each part of the data recovery circuit are described.

The over sampling part 1 includes 12 FFs (F/F0 through F/F11) 4, and parallel data generating part 5, outputting input data in synchronization with one clock signal (for example, CK0).

To each of the FFs F/F0 through F/F11, reception data Data is input in common. The FFs 4 input the respective multiphase clock signals CK0 through CK11 to their input terminals, take the reception data Data with rising up of the respective clock signals, and output outputs Q0 through Q11, respectively.

The parallel data generating part 5 makes the outputs Q0 through Q11 in synchronization with one of the multiphase clock signals (for example, CK0), and outputs the over sampling data OVSD.

Figure 5:
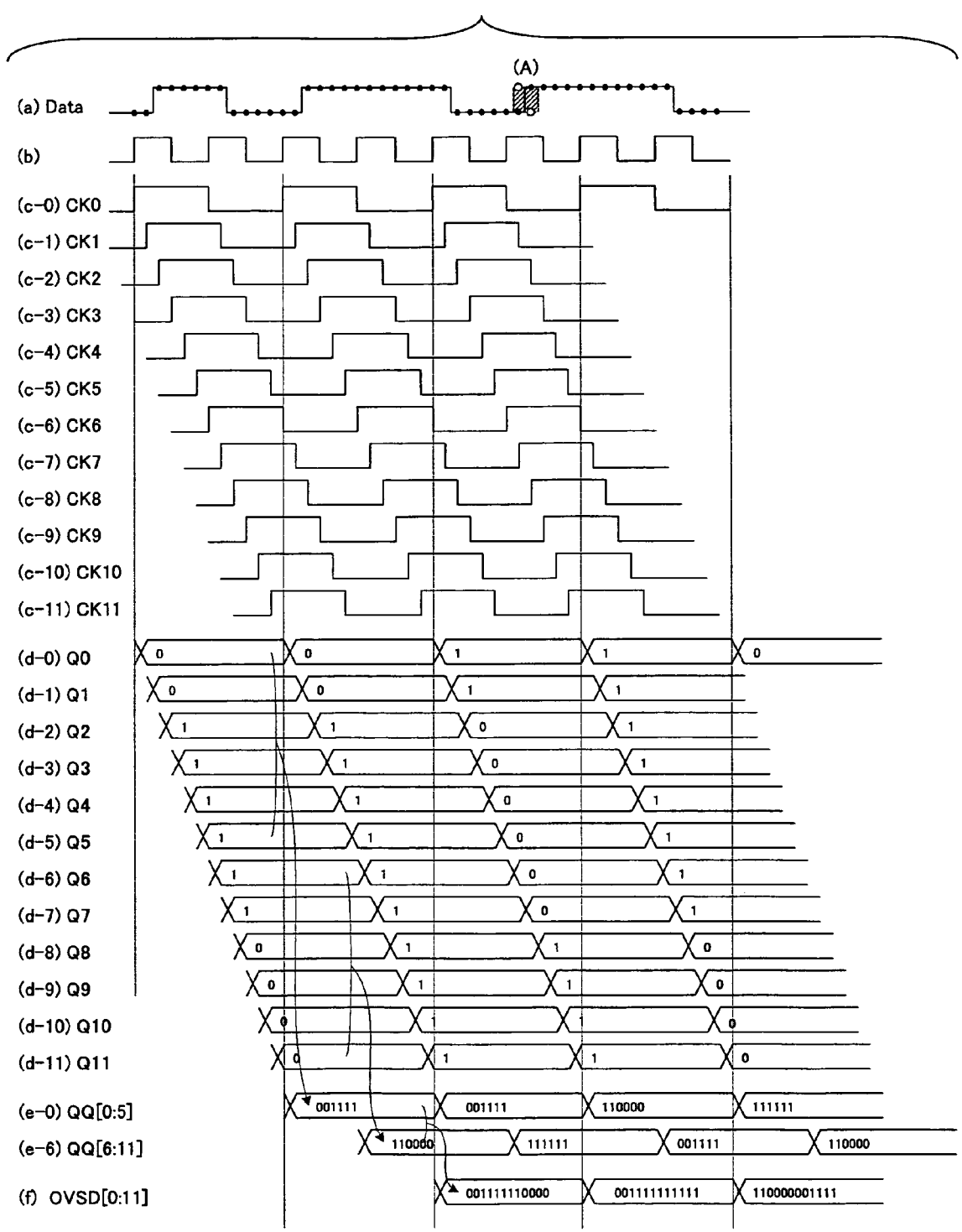
FIG. 5 shows one example of signal waveforms of respective signals in an over sampling part.

FIG. 5 shows one example of signal waveforms of the respective signals in the over sampling part. FIG. 5 (*a*) shows a waveform of the reception data Data. FIG. 5 (*b*) shows the data transfer clock signal (which does not occur there, but is shown for reference). FIG. 5 (*c*-1) through (*c*-11) show the multiphase clock signals CK0 through CK11, which have a period of 2UI, and equal phase intervals thereamong. FIG. 5 (*d*-0) through (*d*-11) show the outputs Q0 through Q11 output from the respective FFs, as a result of being taken thereto by the multiphase clock signals CK0 through CK11, respectively. FIG. 5 (*e*) shows the outputs Q0 through Q5 and Q6 through Q11, taken into the parallel data generating part 5. FIG. 5 (*f*) shows the over sampling data OVSD output by the parallel data generating part 5.

The period of the multiphase clock signals CK0 through CK11 is set in 2 UI, which is two times the period of the data transfer clock signal as described above, and the multiphase clock signals CK0 through CK11 are clock signals in which the phase is shifted thereamong so that they have the equal phase difference between each adjacent ones.

Dots on the reception data Data of FIG. 5 (*a*) denote sampling points of the respective multiphase clock signals CK0 through CK11, and the respective outputs Q0 through Q11 taken by the multiphase clock signals CK0 through CK11 change as shown in FIG. 5 (*d*-0) through (*d*-11), respectively.

The parallel data generating part 5 once takes the outputs Q0 through Q5 by the clock signal CK0 (having the outputs of QQ0 through QQ5), and takes the outputs Q6 through Q11 by the clock signal CK6 (having the outputs of QQ6 through QQ11). Next, the clock signal CK0 is used to take the outputs QQ0 thorough QQ11, obtains parallel synchronized data, and outputs the over sampling data OVSD[0:11]. In FIG. 5, left side corresponds to temporally earlier sampling points.

Thus, Q0 through Q5 are taken by CK0 and then, Q6 through Q11 are taken by CK6. As a result, when Q0 through Q11 are made in synchronization with each other by CK0, a problematic situation that Q11 or Q10 cannot be taken properly due to lack of set up time can be avoided. The number of stages may be further increased for the purpose of achieving, more positively, proper taking of the respective data in the parallel data generating part 5.

Generally speaking, rising up/decaying down of reception data fluctuates at random or due to various causes, as shown by a hatching (A) of FIG. 5. That is, so-called jitter occurs. When jitter occurs, a sample around the data changing timing fluctuates as shown by white dots accordingly. Such jitter may obstruct precise restoration of data. Such a problem can be solved by the data recovery circuit in the present embodiment.

Next, a configuration and a function of the symbol data restoring part 3 for restoring data from the over sampling data OVSD are described.

The symbol data restoring part 3 includes the data selecting part 6, the selection signal generating part 7, the de-serializer 8 and the comma detecting part 9, restores 10-bit symbol data SYM from the over sampling data OVSD, and also, generates symbol clock signal SYMCLK.

The over sampling data OVSD is 12-bit data obtained from sampling of two bits of the transfer data by 6-phase clock signals. Accordingly, data (bits), taken by the predetermined phase clock signal from the over sampling data OVSD should be selectively output.

When the transfer clock signal (which is the reference clock signal of the reception data, and is embedded therein) included in the transmitted data from the transmitting part 122 of the opposite physical layer part 120 and multiphase clock signals (clock signals two times the clock signals CK0 through CK11 shown in FIG. 5 (*b*)) used for sampling in the receiving part 102 of the physical layer 100 have the identical frequencies, a taking phase may be always fixed. However, ordinarily, there is a frequency difference. In order to absorb it, the taking phase should be gradually shifted, and sometimes 1 bit or three bits of data, where 2 bits are output regularly, should be selectively output.

For example, when the frequency difference is 0.1% (=1000 ppm), a shift of 1 bit occurs in 1000 bits of the transfer data. Accordingly, 1-bit or 3-bit output should be made once 500 cycles of the clock signal CK0.

The selection signal generating part 7 generates a selection signal Sel designating the taking phase, from the over sampling data OVSD, and simultaneously, outputs a state signals S0, S1 indicating the number of effective data. When S0=1, this means that the number of effective data is one, while, when S1=1, the number of effective data is three. Regularly, S0=S1=0, which means that the number of effective data is two. Setting is made such that a state that S0=S1=1 does not occur.

The data selecting part 6 selectively outputs 1 through 3 restoration data D0 through D2 from the over sampling data OVSD according to the selection signal Sel and the state signals S0, S1. Further, it outputs state signals S0', and S1' delayed from the state signals S0, S1, respectively, by a predetermined amount. The state signals S0', S1' indicate effective data of the restoration data D0 through D2.

In the transferred serial data, special code called comma is inserted at predetermined intervals. The comma code is used to separate the serial data into 10-bit symbol data SYM. The comma detecting part 9 detects the comma code, and outputs a comma detection signal Det.

The de-serializer DES 8 converts, based on the comma detection signal Det, the 1 through 3 restoration data D0 through D2, provided by the data selecting part 6, into the parallel 10-bit symbol data SYM. Also, it generates the symbol clock signal SYMCLK.

The symbol restoring part 3 is described in further detail.

Figure 6:
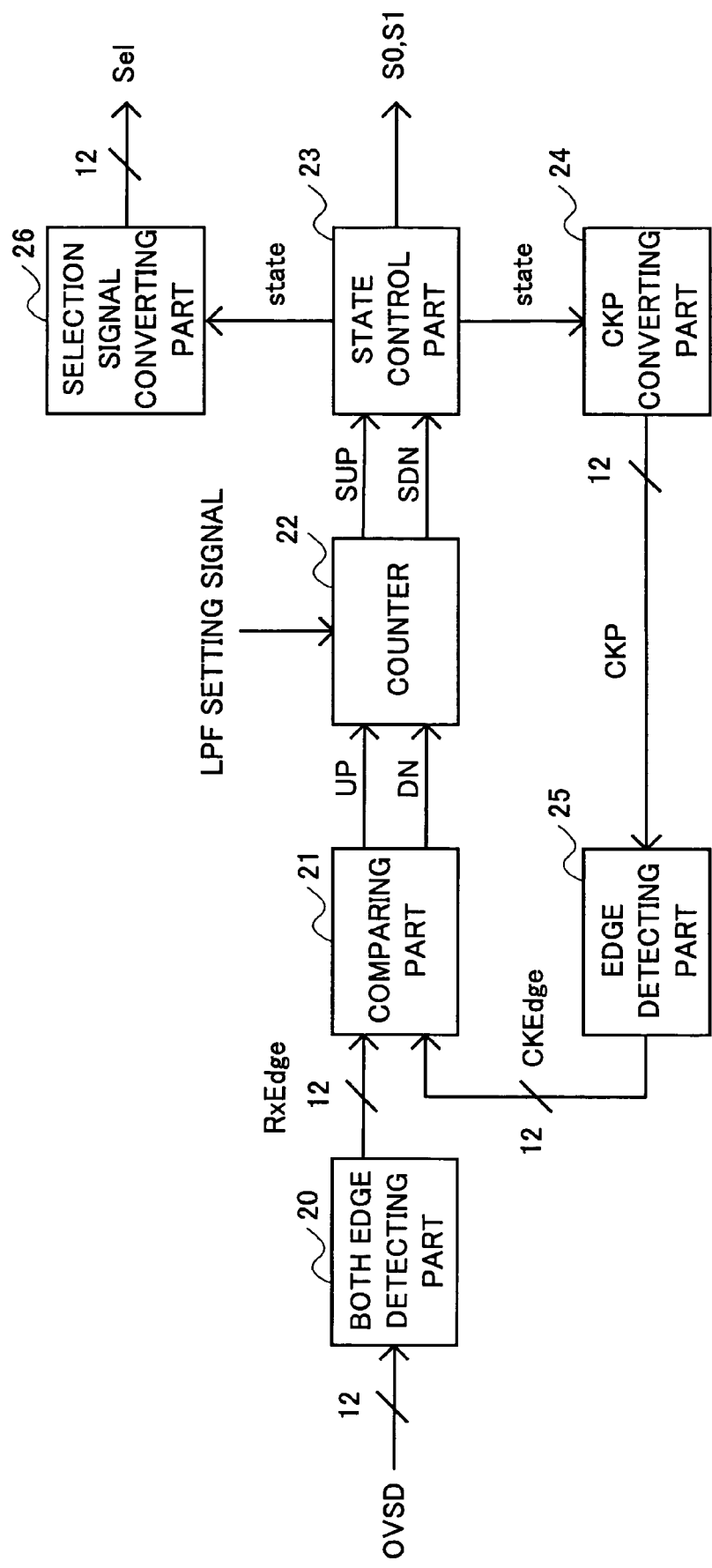
FIG. 6 shows a configuration example of a selection signal generating part.
Figure 7:
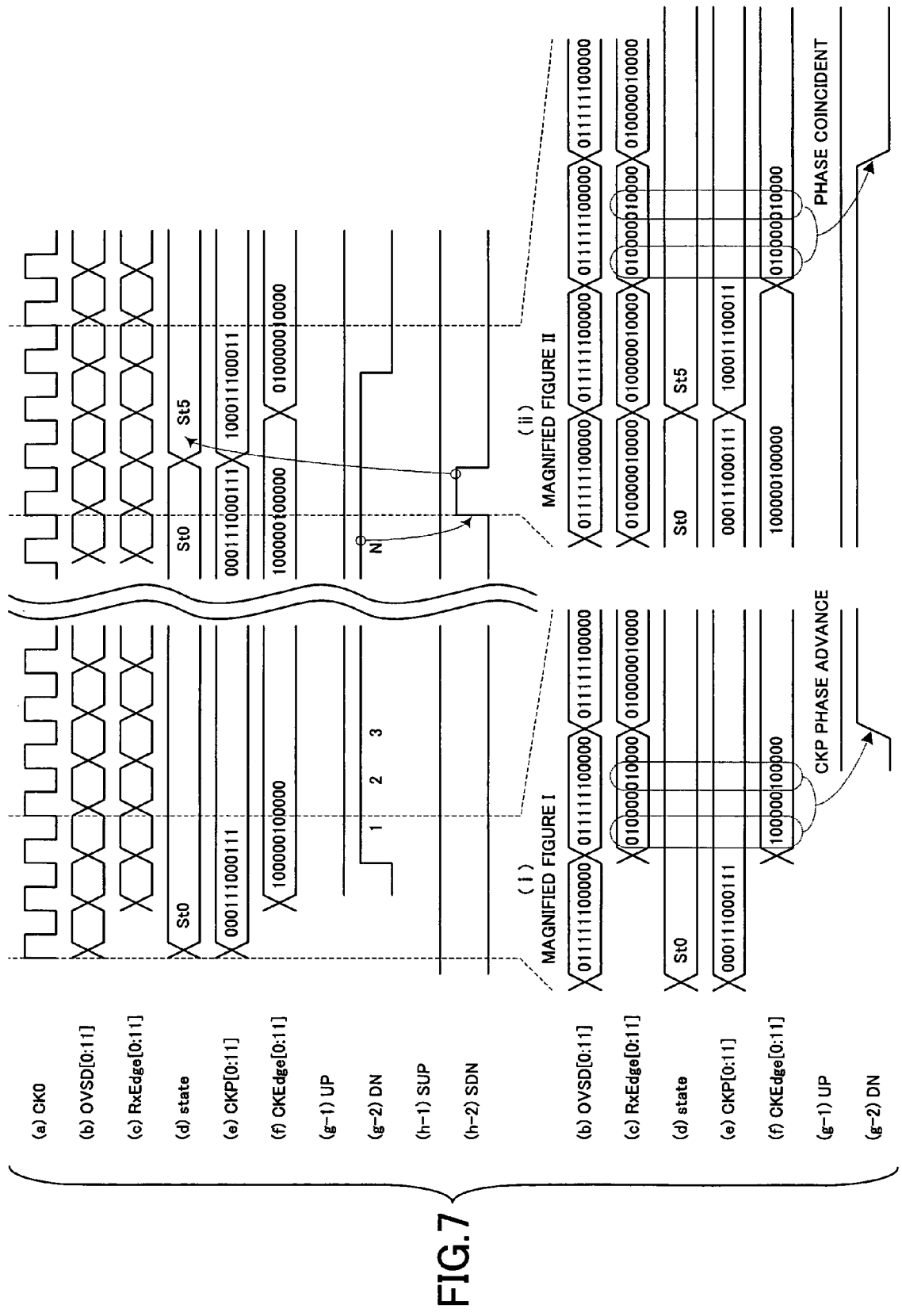
FIG. 7 shows waveform examples of respective signals in the selection signal generating part.

FIG. 6 shows a configuration example of the selection signal generating part 7, and FIG. 7 shows respective signal waveforms in the selection signal generating part 7.

The selection signal generating part 7 includes a both edge detecting part 20, a comparing part 21, a counter 22, a state control part 23, a CKP converting part 24, an edge detecting part 25 and a selection signal converting part 26, and is configured so as to operate with the clock signal CK0 of FIG. 7 (a) provided by the multiphase clock generating part 2, as reference clock timing.

Waveforms of FIG. 7 (b) through (h-2) show the same signals having the same signal names as those of FIG. 5. FIG. 7 (b) through (g-2) on the bottom side show (b) through (g-2) on the top side in a magnified state during a period defined by broken lines. Bit series shown are described in an order from LSB through MSB. LSB shows data which is first received.

FIG. 7 (a) shows the clock signal (CK0) provided by the multiphase-clock generating part 2; FIG. 7 (b) shows the over sampling data OVSD [0:11]; FIG. 7 (c) shows an edge signal RxEdge of the over sampling data OVSD; FIG. 7 (d) shows a change state 'state' obtained when a phase of a clock pattern is changed according to the transfer data; FIG. 7 (e) shows the clock pattern CKP made of a 12-bit series obtained from over sampling of the clock signal CK0; FIG. 7 (f) shows a decaying down edge CKEdge[0:11] of the clock pattern CKP; FIG. 7 (g) shows signals UP, DN showing phase change of the clock pattern CKP; and FIG. 7 (h) shows timing at which the number of times of the signals UP, DN exceeds a predetermined value (N).

The both-edge detection part 20 detects both edges of rising up and decaying down from the over sampling data OVSD (b), and outputs a Rx edge signal RxEdge indicating the edge positions.

This is generated from exclusive OR for each bit between the over sampling data OVSD[0:11] and dOVSD[0:11] obtained from delaying OVSD by one phase. Assuming that pOVSD11 denotes OVSD[0:11] in one clock pulse advance, dOVSD[0:11]={pOVSD11, OVSD[0:10]}. For example, as shown in FIG. 7, assuming that OVSD[0:11]=011111100000 is continuous,

OVSD[0:11]=011111100000 dOVSD[0:11]=001111110000

RxEdge[0:11]=010000010000

The comparing part 21 compares the Rx edge signal RxEdge and a clock decaying down edge signal CKEdge described later, detects which one is in advance, and, outputs the DN signal (g-2) when CKEdge is in advance to RxEdge, while outputs the UP signal (g-2) when it is delayed. When both coincide, it outputs both signals in 'L'.

When RxEdge has a plurality of '1', phase advance/delay is determined for each, and a major one is output. In a case of the same number, the coincidence determination is made.

The counter 22 counts the UP/DN signals provided by the comparing part 21, and outputs a SUP signal (h-1) and a SDN signal (h-2).

Thus the counter 22 averages the UP/DN signals, and thus, it acts as a loop filter in PLL. For example, the counter 22 is made of an up/down counter, increments a count value by 1 when UP='H', while decrements by 1 when DN='H'. Then, when the count value exceeds a predetermined positive number (for example, +N), the SUP signal is output as 'H'. When the count value lowers than a predetermined negative number (for example, –N), the SDN signal is output as 'H'. After that, the count value is cleared in an initial value (for example, 0).

By changing the positive/negative predetermined values, a band of averaging can be changed. The positive/negative predetermined values may be changed by a LPF (loop filter) setting signal.

By averaging in the counter 22, even when jitter is included in the reception signal, and thus, the data change timing in the over sampling data OVSD fluctuates, whether the average position thereof is in advance or delayed can be properly detected.

The positive/negative thresholds should be selected in consideration of a response to the frequency difference from the transmission side. For example, when the frequency difference is 0.1% (=10000 ppm), six times of SUP (or SDN) should occur in 500 clock pulses (CK0). Therefore, N should be not more than 83. However, if this value is set near to the highest limit 83, the control system may be unstable. Accordingly, a value such that sufficient averaging effect can be obtained, i.e., 8 or 16, should be set.

For the purpose of achieving a simpler configuration, a configuration may be made such that, in the comparing part 21, both UP/DN outputs have 'H' when both results of phase advance/delay occur for a plurality of edges, and, the subsequent counter 22 does not make counting up/down when UP=H and DN=H.

The state control part 23 controls six states indicating phase states of the clock pattern CKP, i.e., St0 through St5.

The state control part 23 has a frequency equivalent to the transfer clock signal, and controls the six phase states St0 through St5 of the 12-bit clock pattern CKP, obtained from over sampling from the transfer clock signal with 12-phase clock signals in which one period is equally divided by 12.

Figures 8, 9:
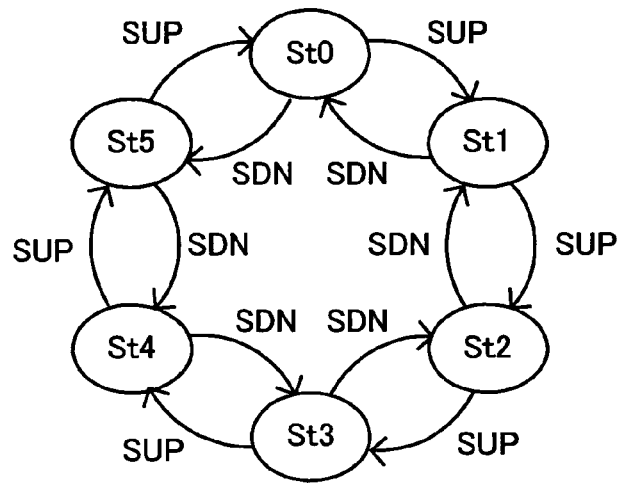
FIG. 8 diagrammatically shows a phase change state of a clock pattern CKP.
FIG. 9 shows one example of a conversion rule of converting a state signal to the clock pattern CKP.

FIG. 8 diagrammatically shows the phase change states of the clock pattern CKP. As shown, a change condition of the clock pattern CKP is that the SUP and SDN signals provided by the counter 22 have 'H', respectively.

For example, an initial state of the phase is assumed as St0. The states St0 through St5 are such that, each time the SUP signal of 'H' is output from the counter 22, the clock pattern CKP (a) phase state changes clockwise one by one in FIG. 8. Similarly, each time the SDN signal of 'H' is output from the counter 22, the clock pattern CKP (a) phase state changes counterclockwise one by one in FIG. 8.

The state control part 23 outputs the state signal indicating this state, and the state signals S0, S1. The state signal S0 becomes 'H' only when change occurs from St4 to St3. The state signal S1 becomes 'H' only when change occurs from St3 to St4.

The CKP converting part 24 converts the state signal into the clock pattern signal CKP. FIG. 9 shows one example of a converting rule for converting the state signal into the clock pattern signal CKP. The clock pattern signal CKP is data obtained from over sampling a clock signal of a period of 1UI by six phases for 1UI. When change occurs St0 through St5, the phase advances one by one.

The selection signal converting part 26 converts the state signal to a selection signal Sel. The selection signal Sel is a signal becoming '1' upon rising up of the clock pattern CKP. FIG. 9 also shows one example of a conversion rule for converting the state signal into the selection signal Sel.

It is noted that, when the state changes from St4 to St3, and changes from St3 to St4, a different pattern is output as shown in FIG. 9. This is because, corresponding to the 'H' period of the above-mentioned S0, S1, the signals S0, S1 indicates the number of '1's (that is, the number of times of clock pulse rising up) in the selection signal Sel. When S0=1, the number of '1's is 1, when S1=1, the number of '1's is 3, and the number of '1's is 2 in the other cases.

The edge detecting part 25 outputs a bit of the clock pattern signal CKP, changing from '1' to '0', i.e., detects a decaying down edge of CKP, and outputs a clock decaying edge signal CKEdge signal.

The clock decaying down signal CKEdge signal is generated from operation ($\overline{\text{CKP}}$ & dCKP) on each bit between the clock pattern signal CKP and dCKP[1:11] delayed from CKP by one phase. "$\overline{\phantom{x}}$" denotes NOT operation, and & denotes logical product operation. Assuming that CKP[11] in advance by one clock pulse is pCKP11, dCKP[0:11]={pCKP11, CKP[0,10]}.

Returning to FIG. 7, in signal waveforms, (b) over sampling data OVSD is one obtained from over sampling of the transfer data '101010 . . . ' by the over sampling part 1, and data '011111100000' continues.

(d) state starts from St0, and, according to the conversion rule of FIG. 9, (e) clock pattern CKP '000111000111' is output. Accordingly, the respective edge signals (c) RxEdge is '010000010000' and (f) CKEdge is '100000100000'.

In the period (i) of the magnified view (I), the decaying down position of the clock pattern CKP is made in advance of the edge position RxEdge of the over sampling data OVSD, (g-2) DN signal has 'H'. Then, when the counted 22 has the count value of –N, (h-2) SDN signal has 'H', and (d) change state 'state' changes to St5. As a result, (e) clock pattern CKP changes to '100011100011', and, as shown in the magnified views II, (c) RxEdge and (f) CKEdge coincides in phase with one another. That is, the clock pattern CKP becomes in synchronization with the over sampling data OVSD.

Next, the data selecting part 6 is described in detail.

Figure 10:
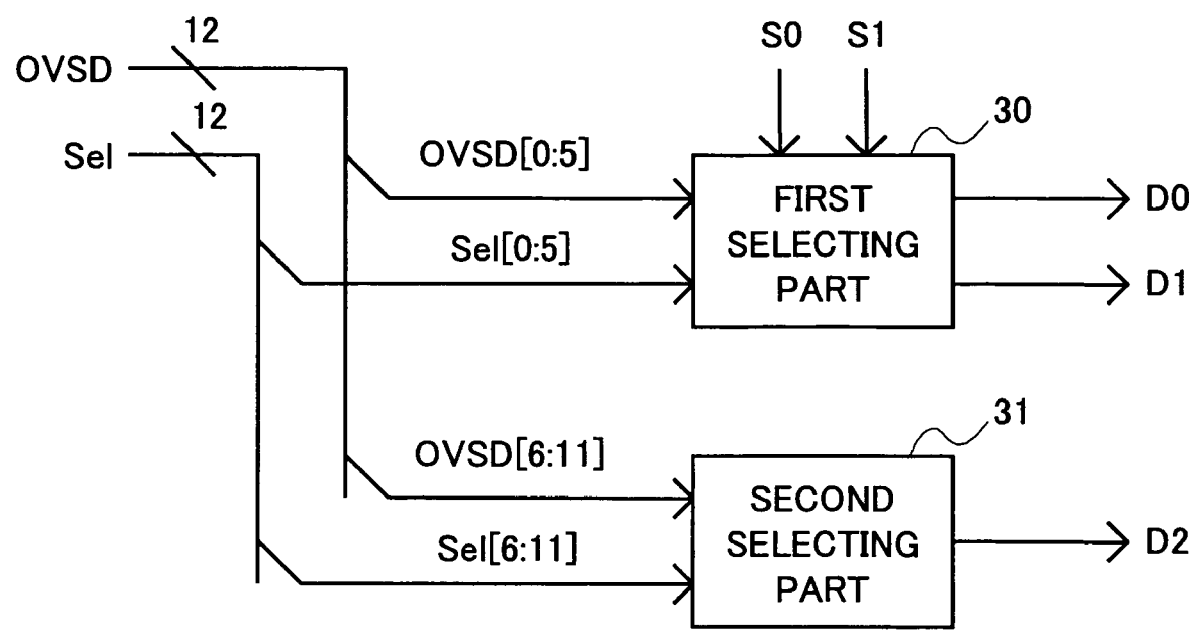
FIG. 10 shows a configuration example of a data selecting part.

FIG. 10 shows a configuration example of the data selecting part 6. The first selecting part 30 restores data D0, D1 from the over sampling data OVSD according to the selection signal Sel[0:5] and the state signal S0, S1. The conversion method is shown below:

When S0='H', both D0, D1 are ignored.
When S1='H', D0 is converted into OVSD[0], and D1 is converted into OVSD[5].
In the other cases, that is, S0=S1='L', D0 is ignored, and D1 is converted into a logical sum of (OVSD[k] & Sel[k]) when k is changed 0 through 5. That is, D1=(OVSD[0]&Sel[0])|(OVSD[1]&Sel[1])|(OVSD[2]& Sel[2])|(OVSD[3]&Sel[3])|(OVSD[4]&Sel[4])|(OVSD[5]&Sel[5])

It is noted that, "&" denotes logical product operation, and "|" denotes logical sum operation. The same manner is also applied hereinafter.

The second selecting part 31 restores data D2 from the over sampling data OVSD[6:11] according to the selection signal Sel[6:11]. The conversion method is shown below:

D2=(OVSD[6]&Sel[6])|(OVSD[7]&Sel[7])|(OVSD[8]& Sel[8])|(OVSD[9]&Sel[9])|(OVSD[10]&Sel[10]))|(OVSD[11]&Sel[11])

That is, by means of the first selecting part 30 and the second selecting part 31,
when S0='H', single D2 data becomes effective;
when S1='H', three data, i.e., D0, D1 and D2 become effective; and
in the other cases (S0=S1='L'), two data, i.e., D1 and D2 become effective, and thus, the original data is restored.

Also, simultaneously, the signals S0', S1', delayed from the respective state signals S0, S1 by the operation delay time in the selecting parts 30, 31, are output. The delayed signals S0', S1' indicate the effective states of the restored data D0, D1 and D2.

FIG. 11 illustrates bit synchronization operation (synchronization operation between the clock pattern CKP and the over sampling data OVSD). A case is considered in which the clock frequency Frx embedded in the reception signal and the receiving side clock frequency Fck (i.e., a clock signal, twice multiplied from the multiphase clock signals CK0 through CK11) does not coincident therewith. FIG. 11 (a) shows a case of Frx>Fck, and FIG. 11 (b) shows a case of Frx<Fck.

In FIG. 11, ΔΦ denotes a phase difference between the reception data (FIG. 5 (a)) and the clock pattern CKP (FIG. 5 (b)). This value becomes positive when the phase of the reception data is in advance. At times ta0, tb0, it is assumed that the clock patterns have a decaying down edge of CK0, i.e., the phase state is St0, and is coincident with the reception data.

(a) When Frx>Fck:

The phase difference ΔΦ gradually increases. However, the reception data is regarded as coincident when ΔΦ is within 0 through π/3 since phase comparison is made between the discrete over sampling data OVSD and clock pattern CKP. When the phase difference exceeds π/3, at time ta1, the phase advance signal UP has 'H', and the counter value Count of the counter 22 increases. Then, when it reaches the predetermined value +N (time ta2), the SUP signal has 'H', and thus, the phase state is made in advance. As a result, the phase of the clock pattern is made in advance by π/3, and thus, the phase difference ΔΦ is reduced by π/3.

(b) When Frx<Fck:

The phase difference ΔΦ gradually decreases, and, the phase delay signal DN is detected when ΔΦ<0. As a result, the counter value Count decreases. Then, when it reaches the predetermined value –N (time tb1), the SDN signal has 'H', and thus, the phase state is delayed. As a result, the phase of the clock pattern is delayed by π/3, and thus, the phase difference ΔΦ is increased by π/3.

The operation of FIG. 11 (a) or (b) is repeated, and thus, a synchronization state results. However, a constant phase difference error still remains as shown.

Figure 12:
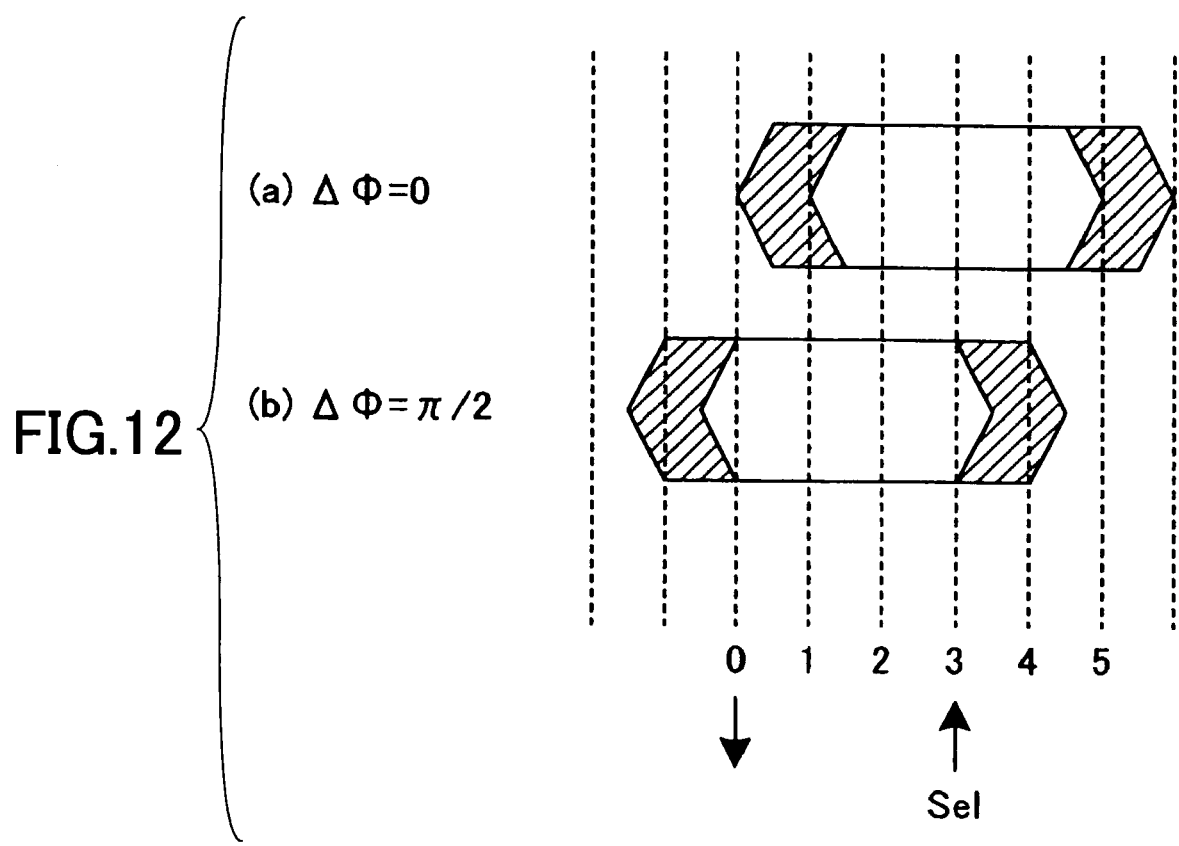
FIG. 12 illustrates a relationship between a phase error and a jitter allowable value.

FIG. 12 illustrates relationship between phase error and jitter. FIG. 12 (a) shows an eye pattern when the phase difference ΔΦ=0, FIG. 12 (b) shows an eye pattern when the phase difference ΔΦ=π/2. In the eye patterns, jitter parts are hatched, and represent a state in which precise restoration cannot be obtained. Eye openings (central non-hatched parts) represent a state in which data can be precisely restored.

When the phase state is St0, a decaying down edge of the clock pattern is in 0 phase. At this time, the selection signal Sel has '1' at a phase 3 (and phase 9). Then, over sampling data OVSD[3] (and OVSD[9]) sampled at the phase 3 (and phase 9) is restored as data. Accordingly, in the jitter amount shown in FIG. 12, the data is precisely restored each case the phase difference ΔΦ is 0 or π/2, since the phase 3 is within the eye opening.

However, when the phase difference occurs as shown in FIG. 12 (b), the phase 3 deviates from the eye opening if the jitter amount increases. In such a case, precise restoration may not be achieved. In such a case, the number of phases of the multiphase clock signals should be increased so that the constant phase error should decrease accordingly.

Figure 13:
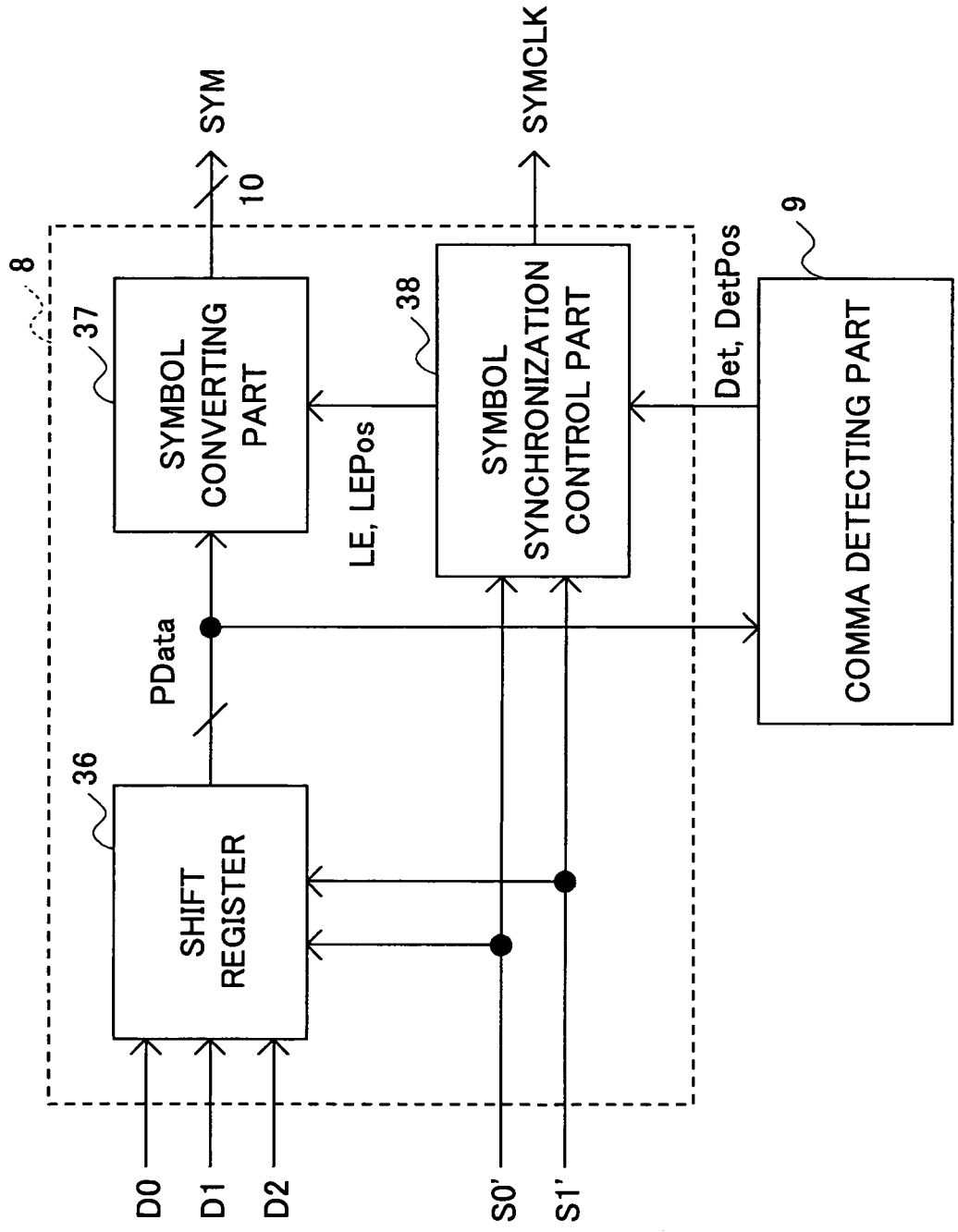
FIG. 13 shows a configuration example of a de-serializer.

FIG. 13 shows a configuration example of the de-serializer 8. The de-serializer 8 includes a shift register 36 to which the restoration data D0, D1 and D2 is input, a symbol converting part 37, and a symbol synchronization control part 38. The shift register 36 shifts the restoration data D0, D1 and D2 sequentially according to the state signals S0', S1', holds it, and outputs the respective register outputs, as parallel data PData.

Figure 14:
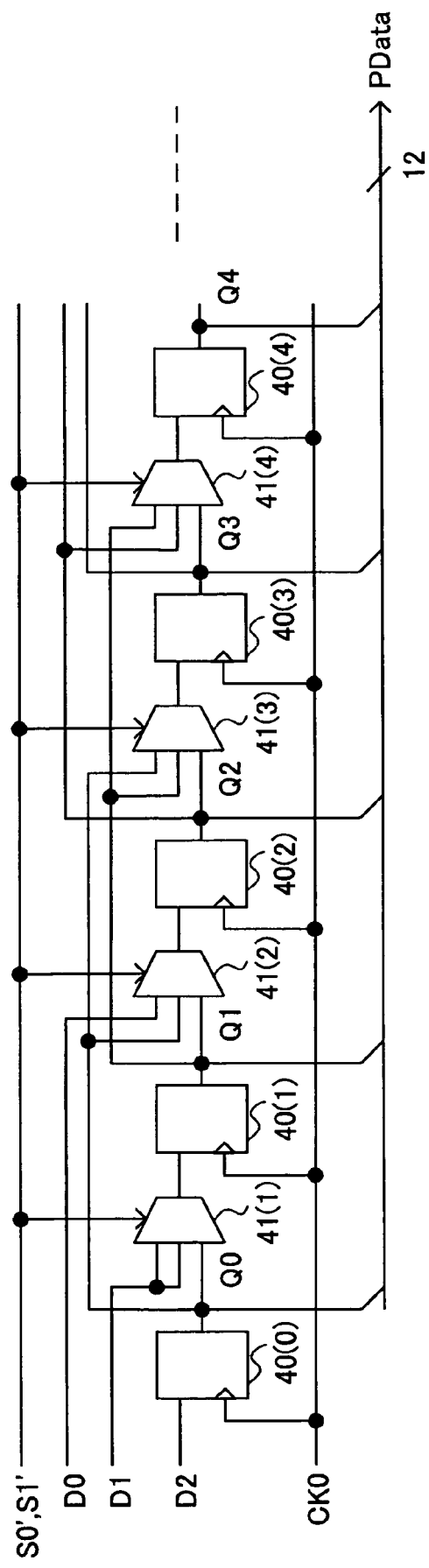
FIG. 14 shows a detailed configuration example of a shift register of the de-serializer.

FIG. 14 shows detailed configuration of the shift register of the de-serializer 8. The shift register 36 includes FFs (registers) 40(0) through 40(11), and a multiplexer 41(1) through 41(11), FFs 40(1) through 40(11) are connected in a cascade manner to form a shift register, the multiplexer 41(1) through 41(11) are provided to change the shift amount according to the state signals S0', S1', and the data input to the respective registers are selected. In the figure, FF 40(5) and the subsequent ones are omitted.

From among the three data input to the multiplexer, the top input is selected when S1'='H', the bottom input is selected when S0' is 'H', and the middle input is selected in the other cases where these inputs corresponds to three-bit shift form the top, two-bit shift and one-bit shift.

12 FFs 40 are provided, and outputs Q1 through Q11 thereof are output as the parallel data PData[0:11]. By this shift register 36, data restored for each one through three is output in parallel. PData[11] is a bit, first transferred (received) (referred to as FRB: First Received Bit, hereinafter), while PData[0] is a bit last transferred (referred to as LRB: Last Received Bit, hereinafter).

The comma detecting part 9 detects whether or not the predetermined comma code is included in the PData provided by the de-serializer 8, and, when the detection result is Det, provides the detected position DetPos (for example, the bit number of the LSB of the detected pattern) to the de-serializer 8.

When 8B/10B converting is carried out, the comma code is '0011111010' (or '1100000101'). There, the left side corresponds to FRB. As other code having an attribute of symbol separation, '0011111001' or '1100000110' may be applied to be detected.

For example, PData[11:0]=100111110101', PData[10:1] coincides with the comma code, Det='H' is output, and simultaneously, DetPos=1 is output by the comma detecting part 9.

Figure 15:
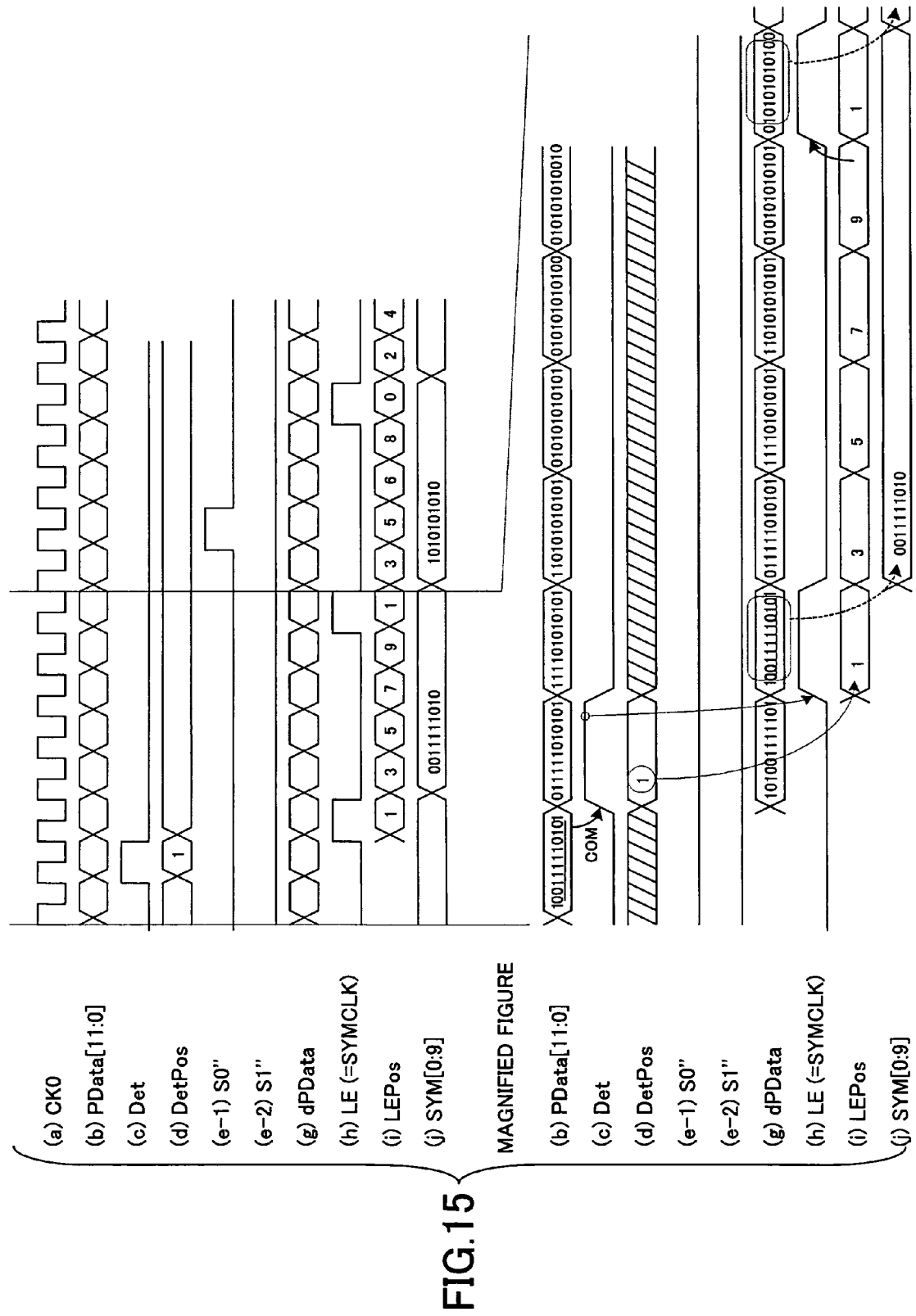
FIG. 15 shows signal waveforms illustrating a symbol synchronization control part and a symbol converting part shown in FIG. 13.

Next, operation of the symbol synchronization control part 38 and the symbol converting part 37 is described. FIG. 15 shows signal waveforms illustrating symbol synchronization operation of the symbol synchronization control part 38 of FIG. 13.

In FIG. 15, PData[11] is the first received bit (FRB), while PData[0] is the last received bit (LRB). FIG. 15 (a) shows the clock signal (CK0), FIG. 15 (b) shows PData[11:0], FIG. 15 (c) shows the detection signal Det, FIG. 15 (d) shows the detection position signal DetPos, FIG. 15 (e) shows the state signals S0', S1', FIG. 15 (g) shows dPData delayed from PData by one clock pulse, FIG. 15 (h) shows the symbol clock signal SYMCLK (the same as a latch enable signal LE), FIG. 15 (i) shows a symbol position signal LEPos indicating a symbol effective position of PData, and FIG. 15 (j) shows the 10-bit symbol SYM signal.

When the comma detecting part 9 detects a comma pattern COM in (b) parallel data PData (FIG. 15, underlined part of magnified figure), the comma detecting part 9 outputs (c) detection signal Det and (d) detection position signal DetPos. The symbol synchronization control part 38 has a counter built-in, and starts counting with the detection signal Det as a start signal and the detection position signal as a count initial value. This counting progresses by the number of the one through three restoration data input to the de-serializer 8. That is, the number of the restoration data is counted with the state signals S0', S1' first, and, each time the count value accumulates for one symbol (10 bits), (h) latch enable signal LE is output (LE has 'H'), and the count value is subtracted by 10. Simultaneously, the count value is output as (i) symbol position signal LEPos indicating the symbol effective position of the parallel data PData. The state signals are delayed by the processing time of the respective blocks (two clock pulses in this example) to obtain S0'', S1'' (e-1, e-2) which are also used for the counting. When S0'' is 'H', the count progresses by 1, when S1''='H', the count progresses by 3, and, in the other cases the count progresses by 2.

The symbol converting part 37 extracts (j) 10-bit symbol SYM[0:9] ([0]: FRB) according to the symbol position signal LEPs when the latch enable signal LE='H', from (g) dPData delayed from the parallel data PData by one clock pulse. That is, when LEPos=0, 1, 2, dPData[9:0], [10:1], [11:2] are extracted, respectively. When LEPos≧3, extraction is carried out with the clock signal occurring in advance. Accordingly, LEPos≧3 does not actually occur. The symbol synchronization control part 38 outputs the symbol clock signal SYMCLK by the signal same as the latch enable signal LE.

Figure 16:
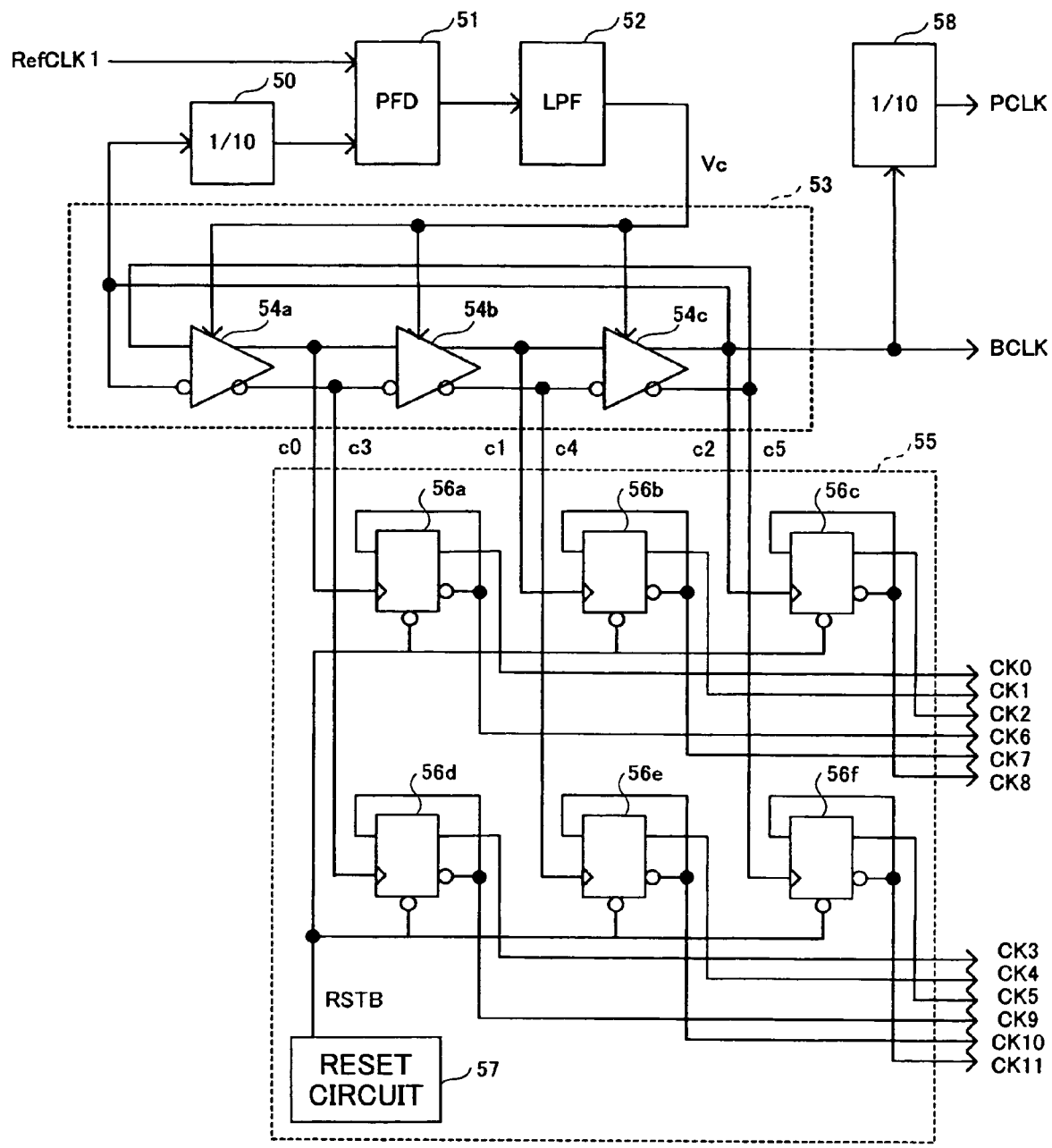
FIG. 16 shows a configuration example of PLL.

Thus, the 10-bit symbol SYM is restored in synchronization with the symbol clock signal SYMCLK. It is noted that the period of the symbol clock signal is ordinarily 5 CK0 clock pulses (i.e., 10 clock pulses of the transfer clock signal). However, it becomes sometimes 4 CK0 clock pulses or 6 CK0 clock pulses due to the frequency difference between the transmission side and the reception side. This difference is absorbed by the elastic buffer EB described above with reference to FIG. 3 for the entire configuration Next, PLL 113 of FIG. 3 is described in detail. FIG. 16 shows a configuration example of PLL 113. PLL 113 includes a frequency divider 50, a phase frequency comparator PFD 51, a low pass filter LPF 52, a voltage controlled oscillator VCO 53, a frequency divider 55 and a frequency divider 58. From the reference clock signal RefCLK, the transfer clock signal BCLK, the internal operation clock signal PCLK and the multiphase clock signals CK0 through CK11 are generated.

VCO 53 is made of a ring oscillator in which 3 stages of differential buffers 54a through 54c are connected, generates 6-phase clock signals c0 through c5, and outputs one thereof as the clock signal BCLK.

The frequency divider 50 divides the frequency by 10, and feeds the output back to the phase frequency comparator PFD 51.

The phase frequency comparator PFD 51 compares phase between the reference clock signal RefCLK with the output of the frequency divider 50, and drives a charge pump inside thereof based on the phase difference information.

The low pass filter smoothes the charge pump output, and provides a control voltage Vc to the voltage controlled oscillator VCO 53.

The differential buffers 54a though 54c in VCO 53 have their delay amounts changing according to the control voltage Vc, and thus, phase synchronization control is carried out. For example, for 250 MHz of the reference clock signal RefCLK1, the differential buffers 54a through 54c generates the transfer clock signal BCLK of 2.5 GHz.

The frequency divider 58 generates the clock signal PCLK from dividing the frequency of the clock signal BCLK.

The frequency divider 55 has six twice-frequency dividers 56a through 56f (made of toggle flip-flops or such) having the clock signals c0 through c5 input as clock inputs. Each of the twice-frequency dividers 56a through 56f divides the frequency of the respective one of the clock signal C0 through C5 by two, and provides forward and backward outputs thereof. That is, the frequency divider 55 generates 12-phase clock signals CK0 through CK11 of the frequency which is ½ of the clock signal BCLK.

These twice-frequency dividers 56a through 56f are reset by an output RSTB of a reset circuit 5, and each phase are set as shown in FIG. 5 (c-0) through (c-11).

As described above, the data recovery circuit according to the present invention generates separate clock signals, without actually restoring the clock signal embodied in the reception data, and restores the reception data and the symbols with these multiphase clock pulses. The selection signal generating circuit 7 virtually restores the clock signal embedded in the reception data form the over sampling data OVSD as the clock pattern CKP. Further, the data selecting part 6 restores the data with the selection signal Sel based on the clock pattern CKP.

Accordingly, the transmitting part 101 and the receiving part 102 (the set of port) of the physical layer 100 can utilize PLL which is separate from PLL 123 of the opposite physical layer 120, in common, and thus, miniaturization of the circuit (chip size), and cost reduction can be achieved.

Figure 17:
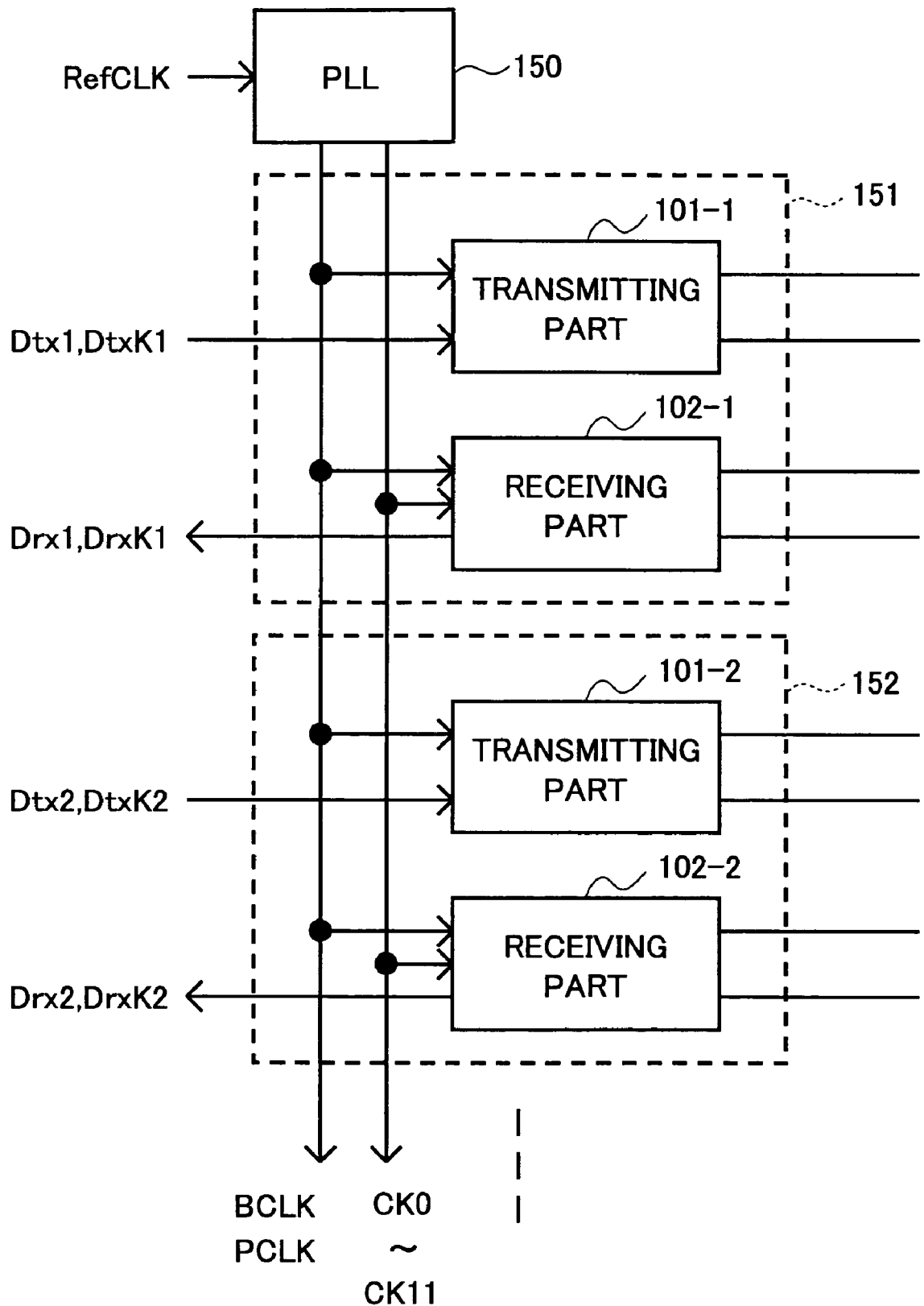
FIG. 17 shows a relationship between a plurality of physical layer parts and PLL.

Such an advantage becomes further effective when the data recovery circuit has a plurality of physical layers. FIG. 17 shows relationship between a plurality of physical layers and PLL. PLL 150 of FIG. 17 also acts as a multiphase clock generating part, and, is configured to provide, to the plurality of physical layers (merely first and second lanes of physical layers 151 and 152 are shown, and the others are omitted), a transfer clock signal BCLK, a clock signal PCLK and multiphase clock signals CK0 through CK11, in common.

The first lane of physical layer 151 has a transmitting part 101-1 and a receiving part 102-1 (having a data recovery circuit according to the embodiment of the present invention). Also the second lane of physical layer 152 has a transmitting part 101-2 and a receiving part 102-2 (having a data recovery circuit according to the embodiment of the present invention).

Also PLL 150 of FIG. 17 provides the transfer clock signal BCLK and the clock signal PCLK generated from a given reference clock signal RefCLK, to the respective transmitting parts 101-1 and 101-2, and also, provides the multiphase clock signals CK0 through CK11 to the respective receiving parts 102-1 and 102-2. That is, according to the data recovery circuit of the present invention, a configuration can be provided such that PLL can be commonly utilized by the plurality of physical layers, and thus, miniaturization of the circuit (chip size), and cost reduction can be achieved.

Further, in the data recovery circuit according to the present embodiment, almost all of the parts, except the over sampling part, operates with the common single frequency clock signal CK0, design can be made almost without taking into consideration of skew among the multiphase clock signals or among data, and thus, high speed data transfer can be easily achieved.

Further, a circuit layout design verification tool, which has been developed sharply in the recent years, may be easily applied. Accordingly, simplification of circuit design can be achieved, reusability of circuits improves, and thus, shortening of the development period can be achieved.

Further, by means of achievement of data parallel processing, the operation frequency can be easily lowered, and thus, increase in the transfer rate can be easily achieved.

The embodiment of the present invention has been described as the example where the 12-phase over sampling is carried out at the frequency which is ½ of the transfer clock signal. However, for example, 24-phase over sampling may be carried out at the frequency which is ¼ of the transfer clock signal. Also in such a case, application of the present invention can be easily made only by means of appropriately changing the above-described respective blocks, and the operation frequency can be further lowered. Accordingly, further increase in the transfer rate can be easily achieved. On the other hand, 6-phase over sampling may be carried out at the frequency of the transfer clock signal. Thus, the number of phases of the multiphase clock signals may be appropriately changed.

A second embodiment of the present invention is described next.

In the second embodiment, data restoration for a case where jitters of various frequency components are included in the reception data is described.

Generally speaking, various frequency components of jitters are included in the reception data. Against a low frequency component of jitter (that is, phase fluctuation), it can be followed by the phase state control by means of the selection signal generating part 7. Accordingly, as described above with reference to FIG. 12, although somewhat phase error remains, the eye opening does not remarkably reduced, and thus, precise data restoration can be achieved.

This flowable frequency band is determined by the control band of the phase state, i.e., the positive/negative predetermined values of the counter 22 set by the LPF setting signal. However, against jitter having a high frequency component more than the control band, the clock pattern CKP phase state cannot follow it, jitter component is added, the eye opening is reduced, and thus, precise data restoration may become difficult.

Figure 18:
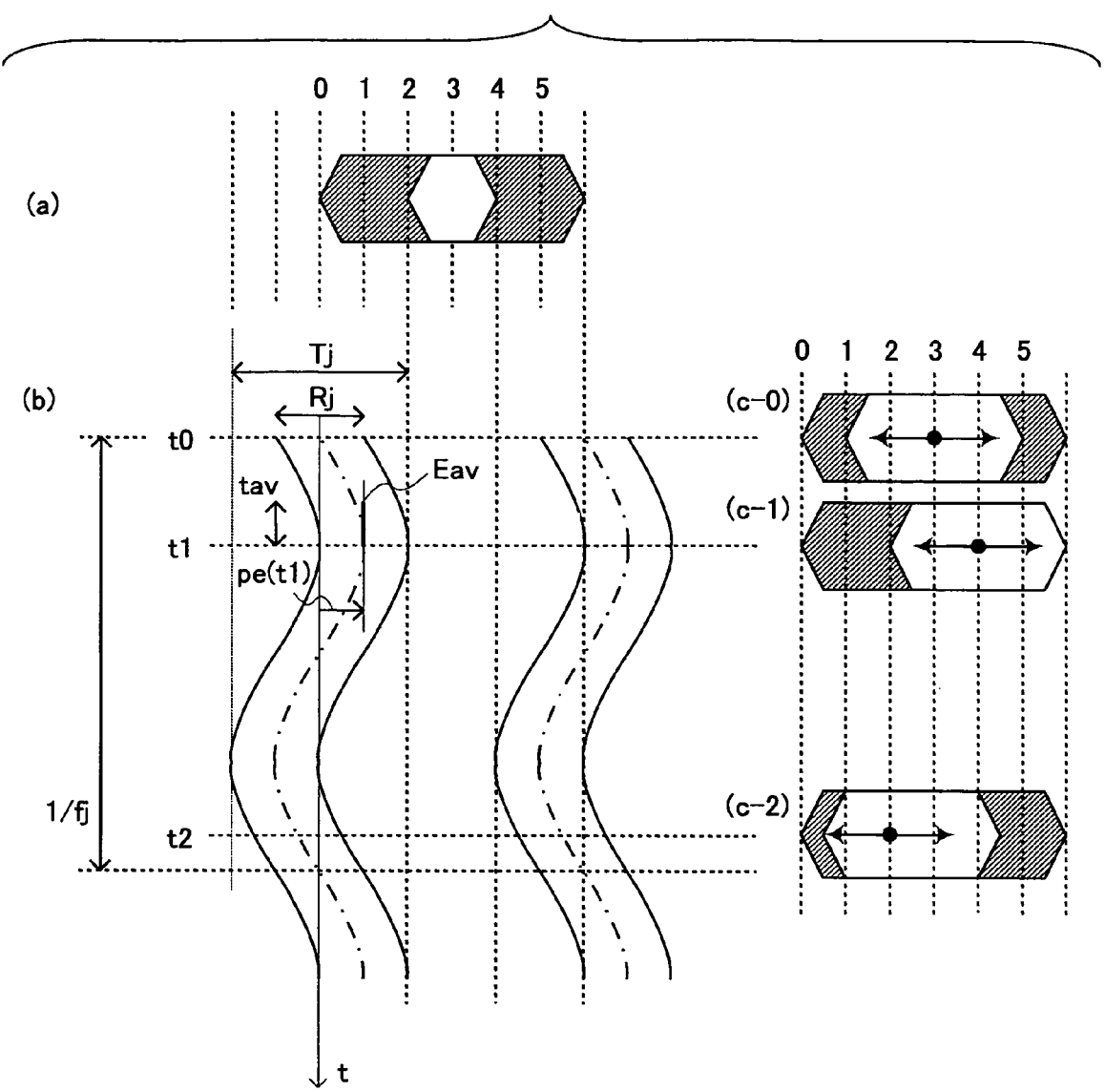
FIG. 18 shows a relationship between a high frequency jitter and an eye opening.

FIG. 18 shows an example of a relationship between high frequency jitter and eye opening. FIG. 18 (b) shows jitter at time t (time elapsing change of jitter), and a random jitter is superimposed to a jitter (chain line) of a frequency fj more than the control band. A peak-to-peak (amplitude) of the random jitter Rj is shown as total jitter Tj. In FIG. 18, for the purpose of illustration, the frequency component fj jitter and the random jitter Rj are superimposed. However, actually various frequency components of jitters are added, and jitters of high frequencies more than fj is generally treated as the random jitter Rj.

Thus, when the total jitter Tj thus appears, an eye pattern shown in FIG. 18 (*a*) appears. That is, the eye opening (central non-hatched part) is remarkably reduced due to the superimposing of the high frequency jitter, and thus precise data restoration becomes difficult.

Further, the jitter depends on PLL characteristics of the opposite port for data transmission, and, in the data receiving apparatus in which various ports are assumed to be connected, it is difficult to set the phase state control band such as to effectively suppress jitters from any opposite ports. Also, the control loop delay cannot be made zero. Therefore, when the control band is elongated to a higher frequency zone, the phase margin reduces, the control becomes usable, and in the worst case, oscillation may occur. Thus, the widening of the control band has a limitation. That is, it has been difficult to precisely restore reception data having jitter characteristics as shown in FIG. 18 (*a*). Such a matter has been applied not only to the data recovery circuit according to the embodiment of the present invention but also to other CDR circuits in the related arts.

FIG. 18 (*c-0*) shows an eye pattern at time t0, (*c-1*) shows an eye pattern at a time t1, and (*c-2*) shows an eye pattern at time t2. As shown in FIG. 18 (*c-0*) through (*c-2*), the center of the eye opening fluctuates time to time. However, at predetermined time, a sufficiently wide eye opening can be obtained. Accordingly, by detecting an average of reception data edges in time tav (for example, $\frac{1}{10} \times (1/fj)$) sufficiently shorter than the jitter period (1/fj) of the frequency fj, and changing (shifting) the phase (dots shown in FIG. 18 (*c-0*) through (*c-2*)) to restore according thereto, precise data restoration can be achieved since the sufficiently wide eye opening is provided for a restoration phase. Below, with reference to figures, data restoration for data including high frequency jitters is described.

Figure 19:
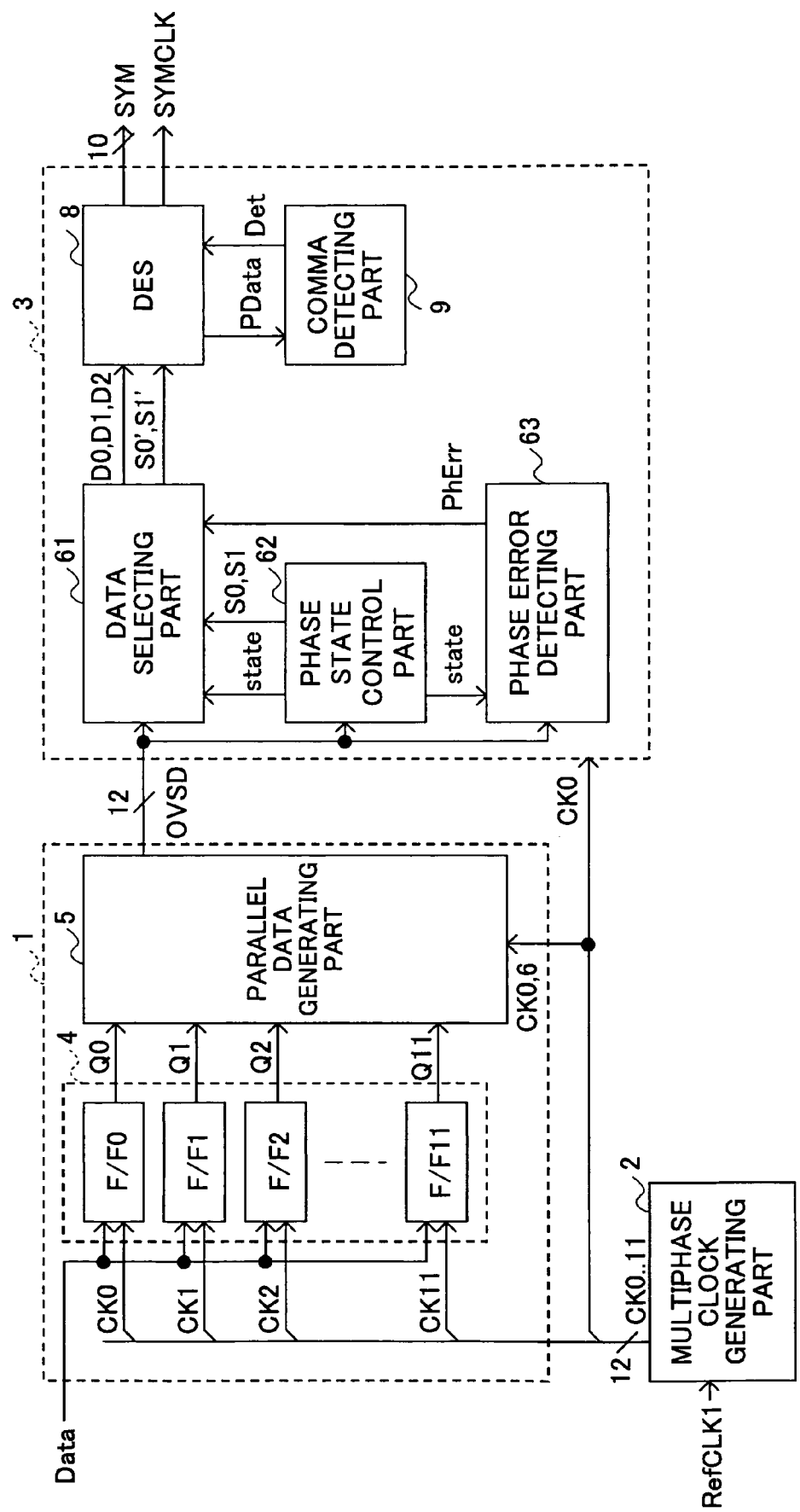
FIG. 19 shows a block diagram of a data recovery circuit in a second embodiment of the present invention.

FIG. 19 shows a block diagram of the data recovery circuit which is a base of the second embodiment. The same reference numerals as those of FIG. 4 are given to the same parts, and duplicate description is omitted. FIG. 19 is different from FIG. 4 in that, in the symbol restoring part of FIG. 4, instead of the selection signal generating part, a phase state control part 62 is provided, a phase error detecting part 63 is provided, and processing in the data selecting part is different.

The same as the selection signal generating part of FIG. 4, the phase state control part 62 detects both edges from the over sampling data OVSD, and generates the phase state signal 'state' controlled so that the decaying edge of the clock pattern CKP is made coincident therewith, and the state signals S0, S1 indicating the number of the effective data. Details of this processing are the same as those of FIG. 6, and, the phase state control part 62 in the second embodiment directly outputs the phase state signal 'state' from the state control part 23, omitting the selection signal converting part 26, in the selection signal generating signal 7 of FIG. 6.

The phase error detecting part 63 detects an average of the edge positions within a predetermined period from the over sampling data OVSD, and generates a phase error signal PhErr indicating an error with respect to the phase state 'state' of the edge position average. That is, an error Pe of the data edge average Eav from the jitter central value in the period tav of FIG. 18 is detected.

The data selecting part 61 selectively outputs the 1 through 3 restoration data D0 through D2 from the over sampling data OVSD according to the phase state signal 'state', the phase signals S0, S1 and the phase error signal PhErr. Further, the state signals S0', S1', indicating the effective data of the restoration data D0 through D2, are output with a predetermined amount of delay according to the circuit delay.

Next, the phase error detecting part 63 is described in details.

Figure 20:
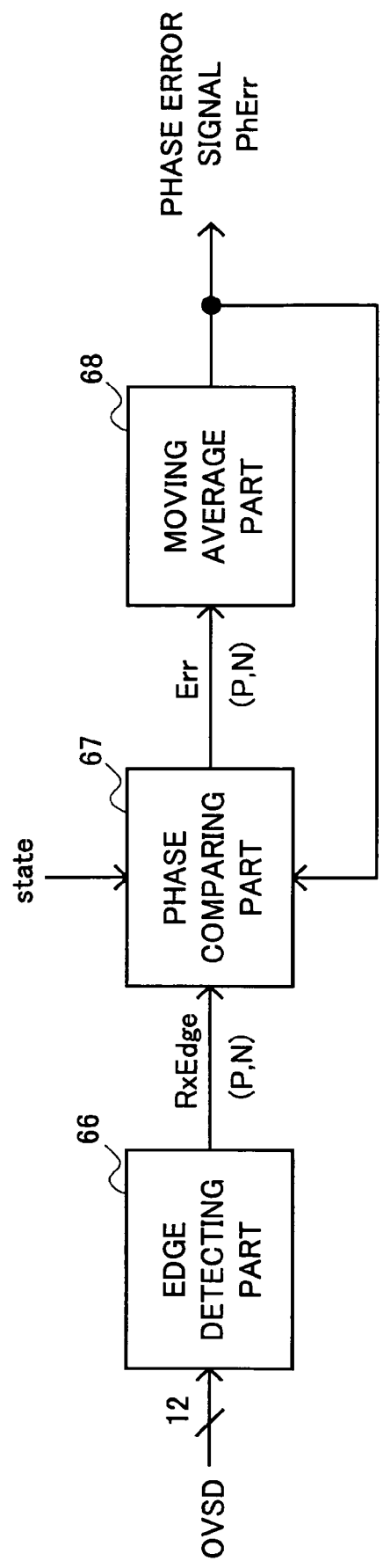
FIG. 20 shows a configuration example of a phase error detecting part.

FIG. 20 shows a configuration example of the phase error detecting part 63. The phase error detecting part 63 includes an edge detecting part 66, a phase comparing part 67 and a moving average part 68.

The edge detecting part 66 detects both rising up and decaying down edges from the over sampling data OVSD, and outputs an edge signal RxEdge indicating the edge positions. That is, it operates the same as the both edge detecting part 20 of FIG. 6. Accordingly, a circuit configuration may be made such that the edge detection part 66 may used in common as the both edge detecting part 20 of the phase state control part 62.

The edge detecting part 66 may be configured, for the purpose of making easier the configuration of the subsequent stage, such that the rising up edge and the decaying down edge are detected separately, and edge signals RxEdgeP and RxEdgeN indicating the respective edge positions are output. In this case, the edge signals RxEdgeP and RxEdgeN can be obtained by operation of RxEdgeP=OVSD & ¯dOVSD, and, RxEdgeN=¯OVSD & dOVSD.

Figures 21, 22:
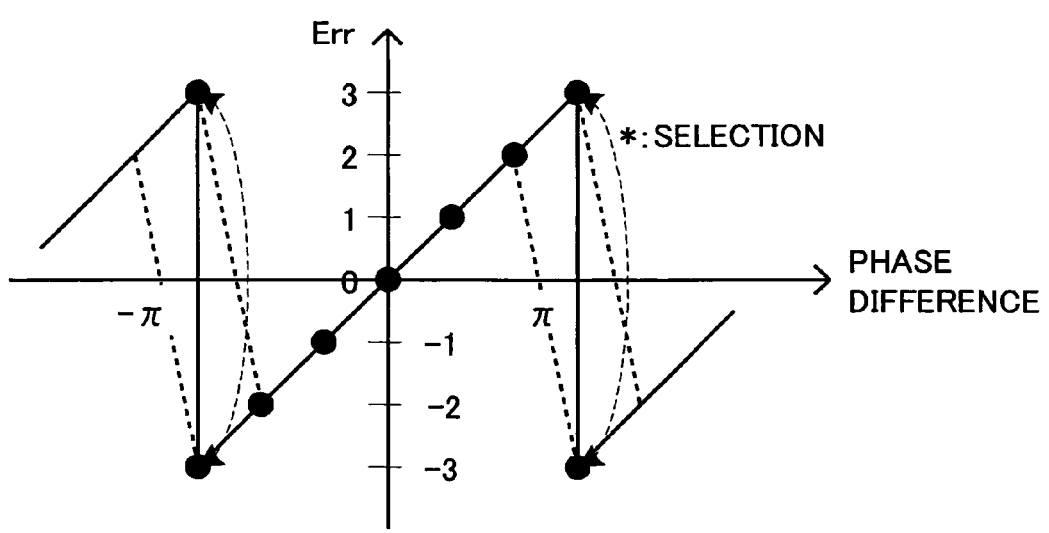
FIG. 21 shows one example of a correspondence table between an edge signal RxEdge(P,N) and a phase state signal 'state'.
FIG. 22 shows phase comparison characteristics in relationship between a phase difference and a phase error Err.

The phase comparing part 67 detects the phase error Err from the decaying down edge of each edge clock pattern CKP, from the edge signal RxEdge(P, N) and the phase state signal 'state', based on a correspondence table. FIG. 21 shows one example of the corresponding table between the edge signal RxEdge(P, N) and the phase state signal 'state'. The phase error Err is calculated based on the edge signal RxEdge(P, N) and the phase state signal 'state', based on the correspondence table of FIG. 21.

According to the correspondence table of FIG. 21, the positive sign is selected when each edge is delayed from the decaying down edge of the clock pattern CKP, the negative sign is selected when it is in advance, and 1 is given when the difference amounts to one phase, Further, the symbol * indicates that +3 or −3 is given. When the sign of the phase error signal PhErr is positive, +3 is given, while, when it is negative, −3 is given. As shown in FIG. 18 (*b*), the jitter central value of the data edge average value Eav fluctuates periodically, and thus, it can be assumed that, when the moving average value is +1, a sharp phase change such that the next edge position becomes −3 does not occur normally. Accordingly, by carrying out such a conversion, the error can be accurately detected around the boundary of ±π.

FIG. 22 shows phase comparison characteristics in relationship between phase difference and phase error Err. Broken lines show a case where +3 or −3 is fixed to. By means of the above-mentioned conversion, accurate detection around ±π can be achieved.

A specific example of the phase error Err detection using the conversion table of FIG. 21 is shown below. It is assumed that the phase state 'state' is St0, the clock pattern CKP is converted as shown in FIG. 9, and the decaying down edge positions are [0] and [6]. Then, when the edge signal RxEdge [0] is 1, it is coincident with the decaying edge of the clock pattern CKP, and thus, the phase error Err is 0. When the edge signal RxEdge[1] is 1, the phase error Err is +1 since the edge position is delayed by one phase.

As described above, the conversion can be easily made when the edge signal is obtained from separate detection of the rising up and decaying down, RxEdgeP has one '1' and RxEdgeN has no '1' within [0] through [5], while, RxEdgeP has one '1' and RxEdgeN has no '1' within [6] through [11].

In this case, the corresponding phase error signals ErrP and ErrN should also be output. Further, logical sum when RxEdgeP[k] for k=0 through 5 indicates whether or not the edge exists in this range, and thus, with the use thereof, a moving average of the subsequent stage is calculated.

Figure 23:
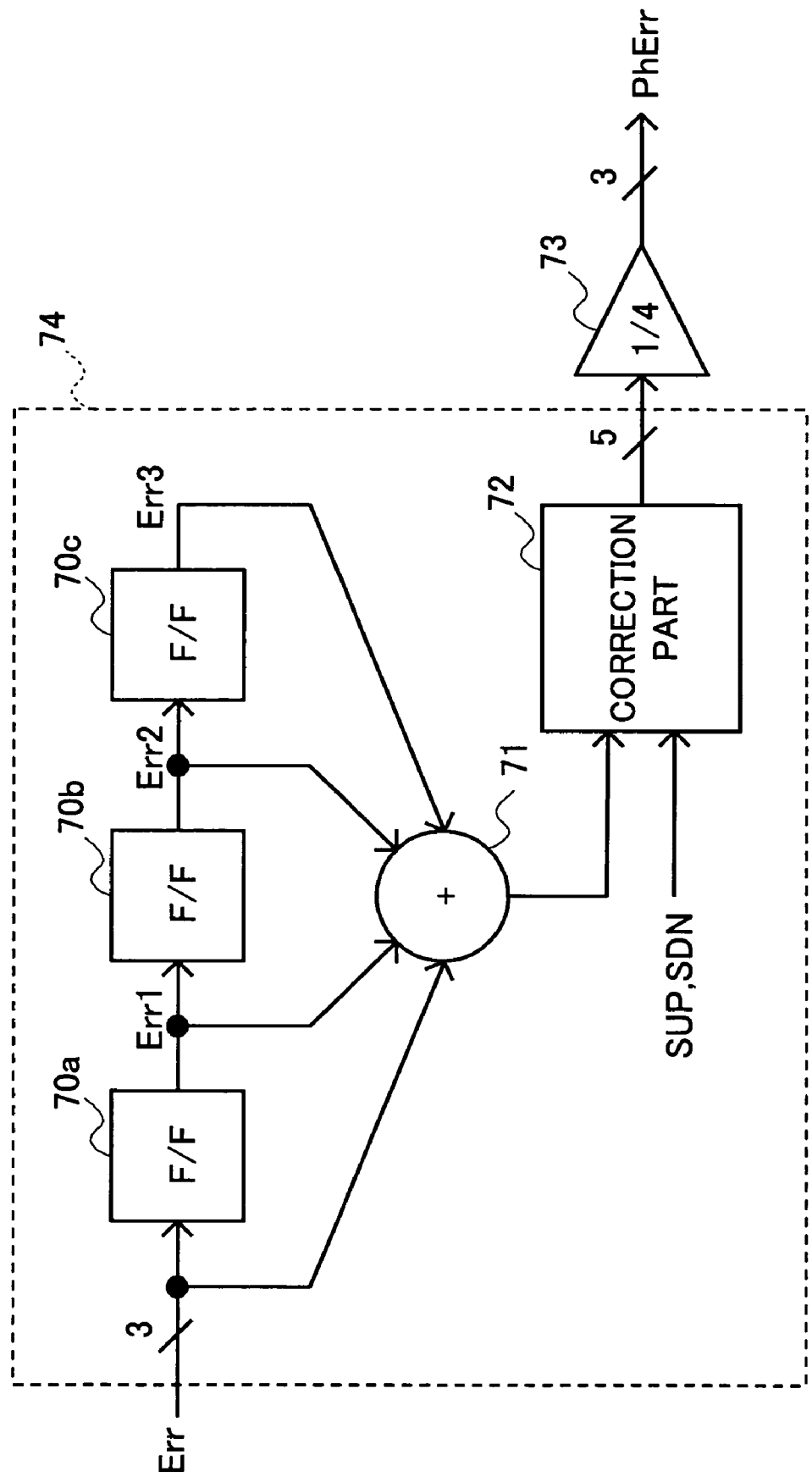
FIG. 23 shows a configuration example of a moving averaging part.

The moving average part 68 calculates an average of immediate n phase errors Err, and outputs the result of the phase error signal PhErr. FIG. 23 shows a configuration example of the moving average part 68 assuming that n=4. The moving average part 68 includes FFs 70a through 70c, an adder 71, a correction part 72 and a multiplier 73.

FF 70a through 70c form a shift register 70, and shifts the error signal Err stage by stage each time the edge is detected. The adder 71 sums the outputs of the respective stages of the shift register 70, i.e., Err, Err1, Err2 and Err3.

The correction part 72 carries out correction when change occurs in the phase state, on the output of the adder 71. That is, when change in the phase state occurs before the error signal Err is calculated, that is, for example, the phase error Err is one for state St1, but Err1 through Err3 are errors detected for state=St0, a correction value of +3 is applied. Thus, the sum of the errors can be corrected for the phase state of state=St1. Change in the phase state occurs when SUP or SDN becomes 'H'. Accordingly, when SUP=H occurs, the correction value of +3 is provided, and it is changed to +2, +1, and then 0, each time the shift occurs. The value of each phase error Err may be −3 through +3, and the correction value is also −3 through +3. Accordingly, the correction part output becomes −15 through +15, and a signal output from the correction part is 5 bits including the sign bit.

The multiplier 73 calculates a phase error average of the output of the correction part 72 by multiplying with ¼, and outputs the result as the phase error signal PhErr. For multiplying ¼, the output of the correction part 72 should be shifted by two bits to the LSB side. Further, counting of fractions of 0.5 and over as a unit and cutting away the rest may be carried out. By averaging the phase errors, high frequency jitter components, such as those included in the random jitter, can be smoothed.

When the phase errors are output separately for rising up and decaying down, two sets of the blocks, defined by the broken line of FIG. 23, are provided, sum values of four edges of each of ErrP and ErrN is calculated, the results are summed, and then, ⅛ should be multiplied with. It is noted that the value n of the moving average may be appropriately changed.

Figure 24:
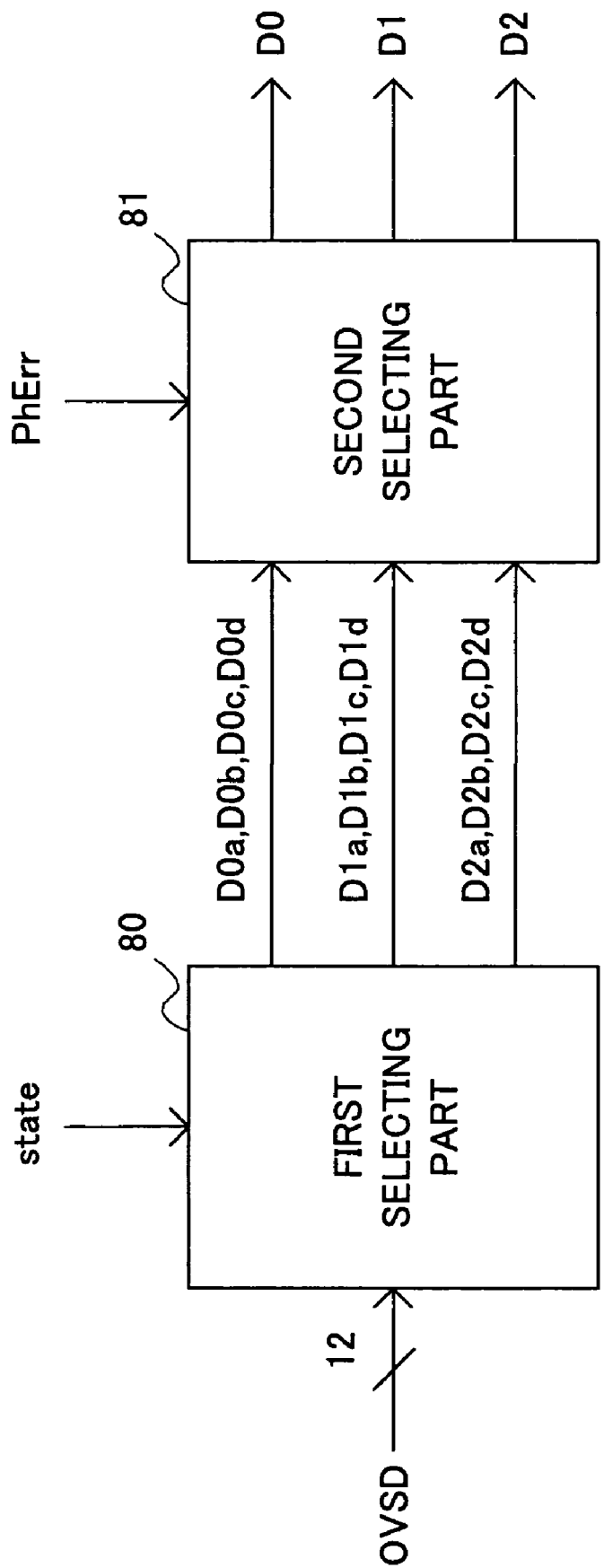
FIG. 24 shows a configuration example of a data selecting part.

The data selecting part 61 is described next. FIG. 24 shows a configuration example of the data selecting part 61. The data selecting part 61 has a first selecting part 80 and a second selecting part 81.

The first selecting part 80 selects a plurality of (in the second embodiment, four, i.e., a through d) candidates for each of the restoration data D1 and D2 (when D0 is also effective, also for D0), from the over sampling data OVSD according to the phase state signal 'state'.

Figure 25:
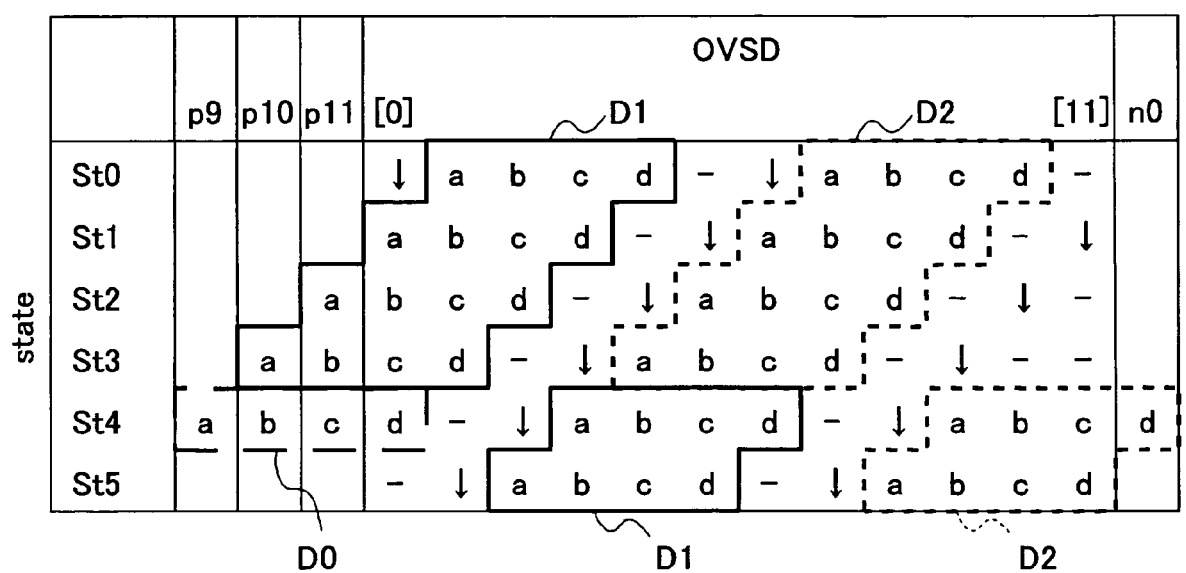
FIG. 25 shows one example of a correspondence table selecting one bit from candidates by a first selecting part.

The first selection part 80 selects the four candidates a through d according to a correspondence table of FIG. 25. In FIG. 25, p9 through p11 denote those delayed from the over sampling data OVSD[9] through [11] by one cycle of the clock signal CK0. The delay is carried out in the first selecting part 80. n0 denotes the over sampling data OVSD[0] of the subsequent cycle.

The first selecting part 80 responds to the phase state 'state', and selects the over sampling data corresponding to the restoration candidates D1a through D1d and D2a through D2d, from a through d of the solid line frame and the broken line frame of FIG. 25. D0a through D0d become effective only when change occurs from St3 to St4. Accordingly, selection is made only for St4, and it is ignored for the other states.

Specifically, when the phase state 'state' is St0, OVSD[0] through [4] are selected as D1a through D1d, respectively, and OVSD[7] through [10] are selected as D2a through D2d, respectively. D0a through D0d are ignored in St0, and thus any data may be applied.

The second selecting part 81 selectively outputs the restoration data D0, D1 and D2 from the restoration data candidates D0a through D0d, D1a through D1d and D2a through D2d, according to the phase error signal PhErr. When the phase error signal PhErr=0, the local reception data edge is coincident with the current phase state (corresponding to the eye pattern of t0 of FIG. 18 (c-0)), and thus, the candidate c which has an opposite phase to the decaying edge position of the clock pattern CKP is selected each. When the phase error signal PhErr=+1, the local reception data edge is delayed approximately by one phase with the current phase state (corresponding to the eye pattern of t1 of FIG. 18 (c-1)), and thus, the candidate d is selected each. Similarly, when the phase error signal PhErr=−1, the candidate b is selected each. When the phase error signal PhErr=−2, the candidate a is selected each. For the phase error signal PhErr=+2, +3 or −3, other candidates may be generated. However, normally, such a large phase error does not occur. Accordingly, in the second embodiment, the candidate d or a is selected. The thus selected data is output as the restoration D0, D1 and D2.

As shown in FIG. 18, the local eye opening center fluctuates in a manner of equivalent to the phase error. Accordingly, by changing the data to select according to the phase error signal PhErr, it is possible to always select the optimum data taking phase, and to restore precise data.

Further, although not shown, in order to consider the phase error signal PhErr calculating time, a delay adjusting part for a predetermined number of clock pulses may be preferably provided subsequent to the first selecting part 80. Further, the order of selection may be inverted between the first selecting part 80 and the second selecting part 81.

Thus, in the second embodiment, it is possible to increase the jitter allowable value of input data having higher frequency components than the control band, without increasing the number of phases of the multiphase clock signals. That is, the phase state control part 62 controls the phase state 'state' in such a manner that the decaying down of the clock pattern CKP may coincide with the jitter center of the reception data, and the phase error detecting part 63 detects the phase error signal PhErr which is a local error of the reception data edge from the jitter center, and restores data according to the phase state 'state' and the phase error signal PhErr. Accordingly, even when the jitter component which is higher than the control band in such a phase state as that of FIG. 18, and is lower than the band of the moving average part 68, the phase of the restoration data is changed according to the phase error. Accordingly, data can be taken always from approximately the center of the eye opening, and thus, stable restoration of precise data can be achieved. That is, since suppression can be carried out also for the jitter not more than the band of the moving average, the jitter allowable value can be enlarged. Further, since the phase error signal PhErr is not fed back to the control system, the control system can be prevented from being unstable even when the band is increased, and there is no possibility of oscillation.

The data recovery circuits and methods in the first and second embodiments according to the present invention may be applied for increasing the data transmission speed inside of an information processing apparatus such as a computer, an image forming apparatus such as a copier, MFP (multifunction printer), a printer, a facsimile machine or such. For example the data recovery circuit in the embodiment of the present invention may be mounted on a predetermined board inside of a computer, and is made to function as a high-speed transmitting/receiving apparatus which receives serial data transmitted from another board, a serial interface or such, or transmits data thereto.

Further, the present invention is not limited to the above-described embodiments, and variations and modifications may be made without departing from the basic concept of the present invention claimed below.

The present application is based on Japanese Priority Application No. 2005-077646, filed on Mar. 17, 2005, the entire contents of which are hereby incorporated herein by reference.

What is claimed is:

1. A data recovery method for restoring serially transferred data in synchronization with a first clock signal having a first frequency by carrying out over sampling, comprising:
   a sampling step of over sampling the serially transferred data with multiphase clock signals generated as a result of shifting a second clock signal having a predetermined second frequency that is lower than the first frequency by a predetermined phase each to obtain over sampling data, wherein the second clock signal is generated from a reference clock signal that is independent of the first clock signal and a phase difference of the multiphase clock signals is several times smaller than the period of the first clock signal;
   a clock pattern generating step of generating a clock pattern, having mutually different phase states according to a data phase state of the over sampling data;
   a phase state control step of detecting rising and decaying edge positions from the over sampling data to obtain a first phase pattern, comparing the first phase pattern and a second phase pattern generated from the clock pattern, and determining a phase state of the clock pattern and a number of effective data indicating the number of bits to extract from the over sampling data;
   a phase error detecting step of detecting an average of edge positions within a predetermined period from the first phase pattern and the second phase pattern, and generating a phase error indicating an error with respect to the phase state of the edge position average; and
   a data selecting step of selecting bits to extract from the over sampling data to restore the data based on the phase state of the clock pattern and the phase error detected in said phase error detecting step.

2. The data recovery method as claimed in claim 1, wherein:
   the phase error in said phase error detecting step is a moving average of the edge positions within the predetermined period, and is used as the phase error in said data selecting step.

3. The data recovery method as claimed in claim 1, wherein:
   in said phase error detecting step, phase advance or phase delay is determined based on the phase error immediately before the phase error becomes approximately π.

4. The data recovery method as claimed in claim 2, wherein:
   in said phase error detecting step, during calculation of the phase error average, when the phase state of the clock pattern changes, the phase error is corrected according to the change state.

5. The data recovery method as claimed in claim 2, wherein:
   a period of determining in said clock pattern generating step whether or not the clock pattern should be changed to have a different phase state is longer than the predetermined period for calculating the moving average of phase error.

6. The data recovery method as claimed in claim 1, wherein:
   said data selecting step comprises:
   a first selecting step of selecting a plurality of candidates of bits to extract from the over sampling data based on the phase state of the clock pattern; and
   a second selecting step of extracting one bit from the plurality of candidates based on the phase error detected in said phase error detecting step.

7. A data recovery circuit for restoring serially transferred data in synchronization with a first clock signal having a first frequency by carrying out over sampling, comprising:
   a sampling part configured to over sample the serially transferred data with multiphase clock signals generated as a result of shifting a second clock signal having a predetermined second frequency that is lower than the first frequency by a predetermined phase each to obtain over sampling data, wherein the second clock signal is generated from a reference clock signal that is independent of the first clock signal and a phase difference of the multiphase clock signals is several times smaller than the period of the first clock signal;
   a clock pattern generating part configured to generate a clock pattern, having mutually different, phase states according to a data phase state of the over sampling data;
   a phase state control part configured to detect rising and decaying edge positions from the over sampling data to obtain a first phase pattern, compare the first phase pattern and a second phase pattern generated from the clock pattern, and determine a phase state of the clock pattern and a number of effective data indicating the number of bits to extract from the over sampling data;
   a phase error detecting part configured to detect an average of edge positions within a predetermined period from the first phase pattern and the second phase pattern, and generating a phase error indicating an error with respect to the phase state of the edge position average; and
   a data selecting part configured to select bits to extract from the over sampling data to restore the data based on the phase state of the clock pattern and the phase error detected by said phase error detecting part.

8. An information processing apparatus comprising the data recovery apparatus claimed in claim 7.

9. The data recovery circuit as claimed in claim 7, wherein:
   said phase error detecting part calculates a moving average of the edge positions within the predetermined period, and said data selecting part uses the moving average of the phase error.

10. An information processing apparatus comprising the data recovery apparatus claimed in claim 9.

11. The data recovery circuit as claimed in claim 7, wherein:
   said phase error detecting part determines phase advance or phase delay based on the phase error immediately before the phase error becomes approximately π.

12. An information processing apparatus comprising the data recovery apparatus claimed in claim 11.

13. The data recovery circuit as claimed in claim 7, wherein:
during calculation of the phase error average, when the phase state of the clock pattern changes, said phase error detecting part corrects the phase error according to the change state.

14. An information processing apparatus comprising the data recovery apparatus claimed in claim 13.

15. The data recovery circuit as claimed in claim 7, wherein:
a period of determining by said clock pattern generating part whether or not the clock pattern should be changed to have a different phase state is longer than the predetermined period for calculating the moving average of phase error.

16. An information processing apparatus comprising the data recovery apparatus claimed in claim 15.

17. The data recovery circuit as claimed in claim 7, wherein:
said data selecting part comprises:
a first selecting part configured to select a plurality of candidates of bits to extract from the over sampling data based on the phase state of the clock pattern; and
a second selecting part configured to extract one bit from the plurality of candidates based on the phase error detected by said phase error detecting part.

18. An information processing apparatus comprising the data recovery apparatus claimed in claim 17.

19. A data transmitting/receiving apparatus, comprising:
a data transmitting part serially transferring data in synchronization with a first clock signal of a frequency f1;
a sampling part configured to over sample the serially transferred data with multiphase clock signals generated as a result of shifting a second clock signal of a frequency f2 that is lower than the frequency f1 by a predetermined phase each to obtain over sampling data, wherein the second clock signal is generated from a reference clock signal that is independent of the first clock signal and a phase difference of the multiphase clock signals is several times smaller than the period of the first clock signal;
a clock pattern generating part configured to generate a clock pattern, having mutually different phase states according to a data phase state of the over sampling data;
a phase state control part configured to detect rising and decaying edge positions from the over sampling data to obtain a first phase pattern, compare the first phase pattern and a second phase pattern generated from the clock pattern, and determine a phase state of the clock pattern and a number of effective data indicating the number of bits to extract from the over sampling data;
a phase error detecting part configured to detect an average of edge positions within a predetermined period from the first phase pattern and the second phase pattern, and generating a phase error indicating an error with respect to the phase state of the edge position average; and
a data selecting part configured to select bits to extract from the over sampling data to restore the data based on the phase state of the clock pattern and the phase error detected by said phase error detecting part.

20. The data transmitting/receiving apparatus as claimed in claim 19, wherein:
said phase error detecting part calculates a moving average of the edge positions within the predetermined period, and said data selecting part uses the moving average of the phase error.

21. The data transmitting/receiving apparatus as claimed in claim 19, wherein:
said phase error detecting part determines phase advance or phase delay based on the phase error immediately before the phase error becomes approximately $\pi$.

22. The data transmitting/receiving apparatus as claimed in claim 20, wherein:
during calculation of the phase error average, when the phase state of the clock pattern changes, said phase error detecting part corrects the phase error according to the change state.

23. The data transmitting/receiving apparatus as claimed in claim 20, wherein:
a period of determining by said clock pattern generating part whether or not the clock pattern should be changed to have a different phase state is longer than the predetermined period for calculating the moving average of phase error.

24. The data transmitting/receiving apparatus as claimed in claim 19, wherein:
said data selecting part comprises:
a first selecting part configured to select a plurality of candidates of bits to extract from the over sampling data based on the phase state of the clock pattern; and
a second selecting part configured to extract one bit from the plurality of candidates based on the phase error detected by said phase error detecting part.

* * * * *